United States Patent
Choi et al.

(10) Patent No.: US 9,603,190 B2
(45) Date of Patent: Mar. 21, 2017

(54) INTEGRATED CIRCUIT ADAPTED FOR MOBILE COMMUNICATION AND RELATED MOBILE COMPUTING DEVICE

(71) Applicants: MASSACHUSETTS INSTITUTE OF TECHNOLOGY, Cambridge, MA (US); NANYANG TECHNOLOGICAL UNIVERSITY, Singapore (SG)

(72) Inventors: Pilsoon Choi, Cambridge, MA (US); Jason Gao, Cambridge, MA (US); Nadesh Ramanathan, Singapore (SG); Chirn-Chye Boon, Singapore (SG); Suhaib Fahmy, Singapore (SG); Li-Shiuan Peh, Cambridge, MA (US)

(73) Assignees: MASSACHUSETTS INSTITUTE OF TECHNOLOGY, Cambridge, MA (US); NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 15/110,042

(22) PCT Filed: Jan. 23, 2015

(86) PCT No.: PCT/SG2015/000021
§ 371 (c)(1),
(2) Date: Jul. 6, 2016

(87) PCT Pub. No.: WO2015/112091
PCT Pub. Date: Jul. 30, 2015

(65) Prior Publication Data
US 2016/0330795 A1 Nov. 10, 2016

Related U.S. Application Data

(60) Provisional application No. 61/930,616, filed on Jan. 23, 2014.

(51) Int. Cl.
*H04M 1/00* (2006.01)
*H04W 88/06* (2009.01)
(Continued)

(52) U.S. Cl.
CPC ......... *H04W 88/06* (2013.01); *H01L 21/8258* (2013.01); *H01L 23/66* (2013.01);
(Continued)

(58) Field of Classification Search
CPC ....... H03F 3/19; H03F 3/601; H01L 2924/00; H01L 2924/00014; H01L 2224/48227;
(Continued)

(56) References Cited

U.S. PATENT DOCUMENTS

| 6,256,511 B1 | 7/2001 | Brown et al. | |
| 2007/0060055 A1* | 3/2007 | Desai | H04B 1/406 455/41.2 |

(Continued)

FOREIGN PATENT DOCUMENTS

| GB | 2310342 A | 8/1997 |
| JP | 2000505608 A | 5/2000 |

(Continued)

OTHER PUBLICATIONS

A. Bettidi et al., "X-band T/R module in 1-21 state-of-the-art GaN technology", Radar Conference, 2009, EuRAD 2009. European., IEEE, Oct. 2, 2009, pp. 258-261.
(Continued)

*Primary Examiner* — Tu X Nguyen
(74) *Attorney, Agent, or Firm* — Innovation Capital Law Group, LLP; Vic Lin

(57) ABSTRACT

An integrated circuit (400) adapted for mobile communication is disclosed. The circuit comprises a first device layer formed of a first semiconductor material and having at least a first circuit portion (402); and a second device layer
(Continued)

350

| | 802.11p (DSRC) | 802.11a (WiFi) |
|---|---|---|
| User mobility | Vehicular (outdoor) | Personal (indoor) |
| Operating frequencies | 5.85-5.925GHz | 5.15-5.825GHz |
| Channel bandwidth | 10MHz | 20MHz |
| Max. output power | 760mW | 40/200mW |
| Data rate | 3-27Mbps | 6-54Mbps |
| Modulation | BPSK-64QAM | BPSK-64QAM |
| OFDM symbol duration | 8us | 4us |
| Guard time | 1.6us | 0.8us |
| Preamble duration | 32us | 16us |
| Subcarrier spacing | 156kHz | 312kHz | formed of a second semiconductor material different to the first semiconductor material and having at least a second circuit portion (404), wherein the first and second device layers are integrally formed, and the first circuit portion is electrically coupled to the second circuit portion to enable the mobile communication using first and second wireless communication protocols. A related mobile computing device is also disclosed.

19 Claims, 14 Drawing Sheets

(51) Int. Cl.

| | | |
|---|---|---|
| H01L 21/8258 | (2006.01) | |
| H01L 27/06 | (2006.01) | |
| H01L 27/092 | (2006.01) | |
| H01L 23/66 | (2006.01) | |
| H01L 29/16 | (2006.01) | |
| H01L 29/20 | (2006.01) | |
| H01L 29/778 | (2006.01) | |

(52) U.S. Cl.
CPC ........ *H01L 27/0605* (2013.01); *H01L 27/092* (2013.01); *H01L 29/16* (2013.01); *H01L 29/20* (2013.01); *H01L 29/2003* (2013.01); *H01L 29/7787* (2013.01); *H01L 2223/665* (2013.01); *H01L 2223/6655* (2013.01)

(58) Field of Classification Search
CPC . H01L 2224/32225; H01L 2224/73265; H01L 2924/181; H01L 2224/97; H01L 2224/48644
USPC ............. 455/63.3, 569.1, 180.1, 552.1
See application file for complete search history.

(56) References Cited

U.S. PATENT DOCUMENTS

| | | |
|---|---|---|
| 2010/0060531 A1* | 3/2010 | Rappaport ............. H01Q 1/243 343/702 |
| 2010/0113089 A1 | 5/2010 | Suzuki et al. |
| 2010/0316033 A1* | 12/2010 | Atwal ................. H04W 74/002 370/338 |
| 2011/0164594 A1 | 7/2011 | Stahlin et al. |
| 2013/0344819 A1* | 12/2013 | Ozgur ..................... H04B 1/40 455/78 |
| 2014/0226639 A1 | 8/2014 | Yi et al. |

FOREIGN PATENT DOCUMENTS

| | | |
|---|---|---|
| JP | 2003100454 A | 4/2003 |
| JP | 2006050396 A | 2/2006 |
| WO | 9730523 A1 | 8/1997 |

OTHER PUBLICATIONS

C. Pilsoon et al., "A case for leveraging 802.11 p for direct phone-to-phone communications", Proceedings of the 2014 international symposium on Low power electronics and design, ACM, Aug. 13, 2014, pp. 207-212.
International Search Report & Written Opinion from corresponding International PCT Application No. PCT/SG2015/000021, 9 pages.
VD Khairnar et al., "Performance of Vehicle-to-Vehicle Communication using IEEE 802.11 p in Vehicular Ad-hoc Network Environment", International Journal of Network Security & Its Applications (IJNSA), vol. 5, No. 2, Mar. 2013, pp. 143-170.
A. Systems, "LocoMate GOâD 'c Battery Powered On-Board Unit," aradasystems.com/pdfs/LocoMate_OBU_Datasheet_v2_12GO.pdf, 2012.
E. Koukoumidis, L.-S. Peh, and M. R. Martonosi, "SignalGuru: leveraging mobile phones for collaborative traffic signal schedule advisory," in Proc. ACM MobiSys, 2011.
F. I. for Secure Information Technology, "simTD Safe and Intelligent Mobility—Test Field Germany," sit.fraunhofer.de/en/offers/projekte/simtd/, 2016.
G. Liu, P. Haldi, T. K. Liu, and A. M. Niknejad, "Fully integrated CMOS power amplifier with efficiency enhancement at power back-off," Solid-State Circuit, IEEE Journal of, vol. 3, No. 43, pp. 433-435, Mar. 2008.
H. Yu, L. Zhong, and A. Sabharwal, "Power management of mimo network interfaces on mobile systems," IEEE Trans. Very Large Scale Integr. Syst., vol. 20, No. 7, pp. 1175-1186, Jul. 2012.
J. A. Fernandez, K. Borries, L. Cheng, B. V. Kumar, D. D. Stancil, and F. Bai, "Performance of the 802.11 p physical layer in vehicle-to-vehicle environments," Vehicular Technology, IEEE Transactions on, vol. 61, No. 1, pp. 3-14, 2012.
J. Emer, P. Ahuja, E. Borch, A. Klauser, C.-K. Luk, S. Manne, S. Mukherjee, H. Patil, S. Wallace, N. Binkert, R. Espasa, and T. Juan, "Asim: a performance model framework," Computer, vol. 35, No. 2, pp. 68-76, 2002.
J. Gao and L. Peh, "RoadRunner: Infrastructure-less vehicular congestion control," in Proc. IEEE Pervasive Computing and Communications (PerCom), 2014.
J. Gao, A. Sivaraman, N. Agarwal, H. Li, and L. Peh, "DIPLOMA: Consistent and coherent shared memory over mobile phones," in Proc. IEEE Computer Design (ICCD), 2012.
J. Jang and K.-B. Lee, "Transmit power adaptation for multiuser ofdm systems," Selected Areas in Communications, IEEE Journal on, vol. 21, No. 2, pp. 171-178, 2003.
J. Liu and L. Zhong, "Micro power management of active 802.11 interfaces," in ACM MobiSys 2008, 2008.
J. Zaldivar, C. Calafate, J.-C. Cano, and P. Manzoni, "Providing accident detection in vehicular networks through obd-ii levices and android-based smartphones," in Local Computer Networks (LCN), 2011 IEEE 36th Conference on, 2011, pp. 813-819.
K. Ali, D. Al-Yaseen, A. Ejaz, T. Javed, and H. Hassanein, "Crowdits: Crowdsourcing in intelligent transportation systems," in Wireless Communications and Networking Conference (WCNC), 2012 IEEE, 2012, pp. 3307-3311.
K. E. Fleming, M. C. Ng, S. Gross, and A. Arvind, "Wills: Architectural modeling of wireless systems," in IEEE International Symposium on Performance Analysis of Systems and Software (ISPASS), 2011.
M. Adler, K. E. Fleming, A. Parashar, M. Pellauer, and J. Emer, "Leap scratchpads: Automatic memory and cache management for reconfigurable logic," in Proceedings of the 19th ACM/SIGDA International Symposium on Field Programmable Gate Arrays, ser. FPGA '11. New York, NY, USA: ACM, 2011, pp. 25-28.
M. Almenoar, "Call for new erp proposals," Straits Times, June, vol. 30, p. 2010, 2010.
M. Amadeo, C. Campolo, and A. Molinaro, "Enhancing {IEEE} 802.11p/wave to provide infotainment applications in {VANETs}," Ad Hoc Networks, vol. 10, No. 2, pp. 253-269, 2012, Recent Advances in Analysis and Deployment of {IEEE} 802.11e and {IEEE} 802.11p Protocol Families.
M. C. Ng, "Airblue : a highly-configurable fpga-based platform for wireless network research," Ph.D. dissertation, Massachusetts Institute of Technology, Dept. of Electrical Engineering and Computer Science., Massachusetts Institute of Technology, 2011.
M. C. Ng, K. E. Fleming, M. Vutukuru, S. Gross, H. Balakrishnan et al., "Airblue: A system for cross-layer wireless protocol development," in Proceedings of the ACM/IEEE Symposium on Architectures for Networking and Communications Systems, 2010, p. 4.
Monsoon Solutions, "Monsoon Power Monitor," http://msoon.com/LabEquipment/PowerMonitor/, 2016.
N. Corporation, "NEC LinkBird-MX," nec.co.jp/press/en/0811/images/1301-01.pdf.
NXP, "NXP Delivers First RoadLINK Product," nxp.com/news/press-releases/2013/10/nxp-delivers-first-roadlinkproduct.html, 2013.

(56) References Cited

OTHER PUBLICATIONS

P. Bergamo, M. Cesana, D. Maniezzo, G. Pau, K. Yao, D. Whiteman, and M. Gerla, "Ieee 802.11 wireless network under aggressive mobility scenario," in Proc. International Teletraffic Congress (ITC), Las Vegas, NV, 2003.
P. Choi, C. Boon, M. Mao, and H. Liu, "28.8 dBm, high efficiency, linear GaN power amplifier with in-phase power combining for IEEE 802.11p applications," Microwave Wireless Component Letters, vol. 23, No. 8, pp. 433-435, Aug. 2013.
P. Chyurlia, H. Tang, F. Semond, T. Lester, J. A. Bardwell, S. Rolfe, and N. G. Tarr, "GaN HEMT and MOS monolithic integration on silicon substrates," Phys. Status Solidi C, vol. 8, No. 7-8, pp. 2210-2212, 2011.
P. Deshpande, X. Hou, and S. R. Das, "Performance comparison of 3g and metro-scale wifi for vehicular network access," in Proceedings of the 10th ACM SIGCOMM Conference on Internet Measurement, ser. IMC '10. New York, NY, USA: ACM, 2010, pp. 301-307.
P. Gomes, C. Olaverri-Monreal, and M. Ferreira, "Making vehicles transparent through v2v video streaming," Intelligent Transportation Systems, IEEE Transactions on, vol. 13, No. 2, pp. 930-938, 2012.
P. Papadimitratos, A. La Fortelle, K Evenssen, R. Brignolo, and S. Cosenza, "Vehicular communication systems: Enabling technologies, applications, and future outlook on intelligent transportation," Communications Magazine, IEEE, vol. 47, No. 11, pp. 84-95, 2009.
P. Sutton, J. Lotze, H. Lahlou, S. Fahmy, K. Nolan, B. Ozgul, T. Rondeau, J. Noguera, and L. Doyle, "Iris: an architecture for cognitive radio networking testbeds," Communications Magazine, IEEE, vol. 48, No. 9, pp. 114-122, 2010.
R. Ramanathan and R. Rosales-Hain, "Topology control of multihop wireless networks using transmit power adjustment," in IEEE INFOCOM 2000, 2000.
R. S. Nikhil and Arvind, "What is bluespec?" SIGDA Newsl., vol. 39, No. 1, pp. 1-1, Jan. 2009.
S. Networks, "MobiWAVE on Board Equipment," savarinetworks.com/files/MobiWAVE-DSFamily.pdf, 2012.
J. Radhakrishna, L. Wei, D.-S. Lee, T. Palacios, and D. Antoniadis, "Physics-based GaN HEMT transport and charge model: Experimental verification and performance projection," in IEEE International Electron Devices Meeting (IEDM), 2012, 2012, pp. 13.6.1-13.6.4.
V. Camarchia, J. Fang, J. M. Rubio, M. Pirola, and R. Quaglia, "7 GHz MMIC GaN Doherty power amplifier with 47% efficiency at 7 dB output back-off," Microwave Wireless Component Letters, vol. 23, No. 1, pp. 34-36, Jan. 2013.
W. E. Hoke, R. V. Chelakara, J. P. Bettencourt, T. E. Kazior, J. R. LaRoche, T. D. Kennedy, J. J. Mosca, A. Torabi, A. J. Kerr, H-S. Lee, and T. Palacios, "Monolithic integration of silicon CMOS and GaN transistors in a current mirror circuit," J. Vac. Sci. Technol., vol. 30, No. 2, pp. 02B101-1-02B101-6, 2012.
"Systeme COoperatif Routier Experimental Francais," team.inria.fr/imara/projet/scoref/, Jul. 27, 2016.
"The connected vehicle test bed: Available for device and application development," www.its.dot.gov/factsheets/connected_vehicle_testbed_factsheet.htm, US Department of Transportation, 2013.
"iphone 4 teardown," ifixit.com/Teardown/iPhone+4+Teardown/3130, iFixit, 2010.
A. Balasubramanian, R. Mahajan, A. Venkataramani, B. N. Levine, and J. Zahorjan, "Interactive wifi connectivity for moving vehicles," in Proceedings of the ACM SIGCOMM 2008 Conference on Data Communication, ser. SIGCOMM 08. New York, NY, USA: ACM, 2008, pp. 427-438.
A. Khattab, J. Camp, C. Hunter, P. Murphy, A. Sabharwal, and E. W. Knightly, "Warp: A flexible platform for cleanslate wireless medium access protocol design," SIGMOBILE Mob. Comput. Commun. Rev., vol. 12, No. 1, pp. 56-58, Jan. 2008.
A. L. Shimpi, "Samsung's galaxy s4: Introduction and hands on," anandtech.com/show/6832/ samsungs-galaxy-s-4-introduction-hands-on/3, AnandTech, 2013.
A. Systems, "LocoMate Goâ˜D 'c Battery Powered On-Board Unit," aradasystems.com/pdfs/LocoMate_OBU_Datasheet_v2.12GO.pdf, 2012.
Car 2 Car, "CAR 2 CAR Communication Consortium," car-to-car.org, Sep. 14, 2016.
CohdaWireless, "MK2 WAVE-DSRC Radio," cohdawireless.com/product/mk2.html, 2007-2012.
D. Carona, A. Serrador, P. Mar, R. Abreu, N. Ferreira, T. Meireles, J. Matos, and J. Lopes, "A 802.11 p prototype implementation," in Intelligent Vehicles Symposium (IV), 2010 IEEE. IEEE, 2010, pp. 1116-1121.
D. Gustafsson, J. C. Cahuana, D. Kuylenstiema, I. Angelov, N. Rorsman, and C. Fager, "A wideband and compact GaN MMIC Doherty amplifier for microwave link applications," Microwave Theory Techn., IEEE Trans. on, vol. 61, No. 2, pp. 922-930, Feb. 2013.

* cited by examiner (c)

(d)

| | 802.11p (DSRC) | 802.11a (WiFi) |
|---|---|---|
| User mobility | Vehicular (outdoor) | Personal (indoor) |
| Operating frequencies | 5.85-5.925GHz | 5.15-5.825GHz |
| Channel bandwidth | 10MHz | 20MHz |
| Max. output power | 760mW | 40/200mW |
| Data rate | 3-27Mbps | 6-54Mbps |
| Modulation | BPSK-64QAM | BPSK-64QAM |
| OFDM symbol duration | 8us | 4us |
| Guard time | 1.6us | 0.8us |
| Preamble duration | 32us | 16us |
| Subcarrier spacing | 156kHz | 312kHz |

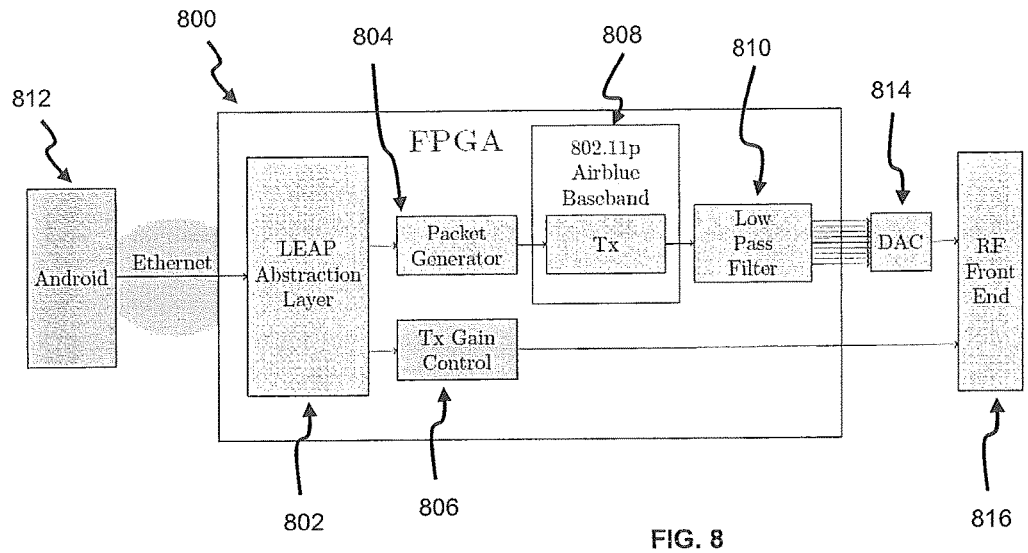
FIG. 8
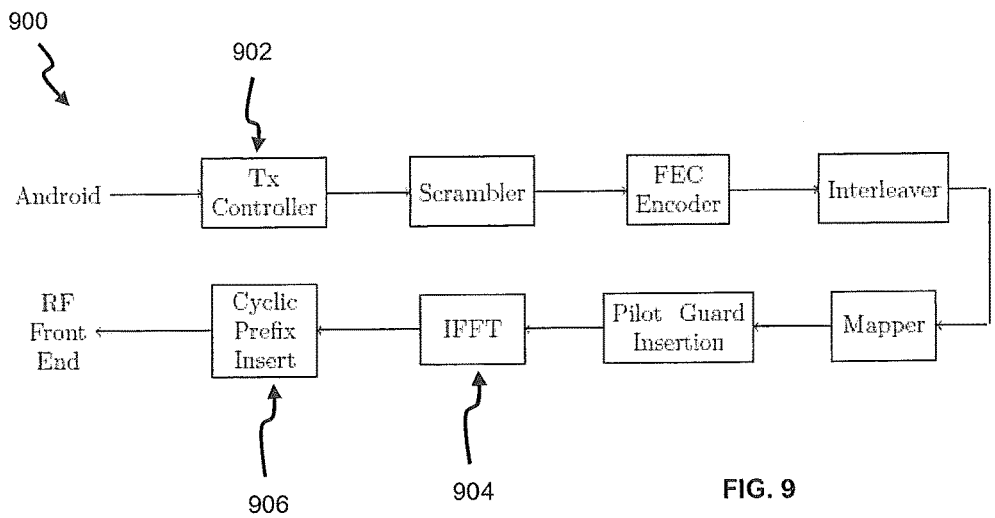
FIG. 9
| Name | Purpose | Number of Bits |
|---|---|---|
| SendPacket | Packet data into baseband | 32 bits |
| SetRate | Configure transmission data rate (6 Mbps to 54 Mbps) | 3 bits |
| SetLength | Configure transmission length | 12 bits |
| SetEnable | Enable/disable transmission | 1 bit |
| SetDelay | Backoff time between transmissions | 24 bits |
FIG. 10

(a)

1510

(b)

1520

(c)

(a)

(b)

INTEGRATED CIRCUIT ADAPTED FOR MOBILE COMMUNICATION AND RELATED MOBILE COMPUTING DEVICE

FIELD & BACKGROUND

The present invention relates to an integrated circuit adapted for mobile communication and related mobile computing device.

Direct device-to-device (D2D) communication between smartphones has been available for years via WiFi's Ad-hoc mode, but as operating system modifications are required to set up D2D, D2D usage thus has not really taken off, until with recent adoption of the WiFi Direct standard. Video sharing, file sharing, as well as multiplayer games are starting to leverage WiFi Direct. Clearly, there are peer-to-peer applications that benefit from the faster response times of D2D communications; these applications gather user input and sensor data from nearby smartphones, perform computations in-situ, and provide results and user interface updates with higher responsiveness. However, existing D2D communication only works under short-range and low mobility scenarios. WiFi usage is challenging in long range or high-mobility scenarios. WiFi Direct facilitates easier setup of device-to-device networks, but one device needs to serve as an access point (i.e. the group owner) and all other devices then communicate through the access point, which means highly mobile networks with rapidly changing topologies are unsupported. This largely limits WiFi Direct applications to close-range, and static deployments between a few smartphones. LTE Direct is regarded as a promising new D2D technology, but as it leverages on LTE infrastructure, LTE Direct requires modifications to the LTE base stations which may hinder widespread adoption.

Vehicle-to-vehicle (V2V) communication is a form of D2D communication, and has been burgeoning with the adoption of the IEEE 802.11p DSRC standard around the world. Numerous V2V applications in the transportation domain have been proposed or deployed, such as mobile multimedia, safety, road pricing, and others. These applications leverage the high mobility, long range and fast response times of 802.11p for next-generation transportation applications. The increased transmit power allowed in the 802.11p specifications enables longer range communications, but the high power consumption of 802.11p radios has conventionally precluded their integration into non-vehicular mobile devices.

SUMMARY

According to a $1^{st}$ aspect of the invention, there is provided an integrated circuit adapted for mobile communication, comprising a first device layer formed of a first semiconductor material and having at least a first circuit portion; and a second device layer formed of a second semiconductor material different to the first semiconductor material and having at least a second circuit portion, wherein the first and second device layers are integrally formed, and the first circuit portion is electrically coupled to the second circuit portion to enable the mobile communication using first and second wireless communication protocols.

The proposed integrated circuit is advantageously realised using a monolithic integrated process for bonding together an III-V substrate and a silicon-based substrate to substantially reduce a die area required for the circuit and its related power consumption, which enables realization of 802.11p communications in a form factor suitable for inclusion in smartphones to allow for high-mobility, low latency, and long-range phone-to-phone (or device-to-device) communications. Additionally, power reduction through application level power control on a smartphone is achievable using a power amplifier (PA) of the integrated circuit, formed of an III-V semiconductor material, which may maintain its high efficiency at lower output power.

Preferably, the first semiconductor material may include a silicon-based material.

Preferably, the second semiconductor material may include a group III-V material.

Preferably, the group III-V material may include GaN, GaAs, AlGaAs or InGaAs.

Preferably, the integrated circuit may integrally be formed as a single die or a semiconductor package.

Preferably, the first and second wireless communication protocols may include being selected from the IEEE 802.11 protocol.

Preferably, the first wireless communication protocol may include the IEEE 802.11a protocol.

Preferably, the second wireless communication protocol may include the IEEE 802.11p protocol.

Preferably, the second circuit portion may include a GaN power amplifier and a SPDT.

Preferably, the GaN power amplifier may be formed from GaN HEMTs.

Preferably, the first circuit portion may include an RF amplifier formed of the first semiconductor material.

Preferably, the second circuit portion may include an RF amplifier formed of the second semiconductor material.

Preferably, the GaN power amplifier may be configured to operate with a clock frequency and a channel frequency specified by the IEEE 802.11p protocol.

Preferably, the first circuit portion may further include a transceiver and a digital baseband processor.

Preferably, the digital baseband processor may be configured to adaptively operate between first and second clock frequencies, the first clock frequency used when the circuit is configured to perform communication via the first wireless communication protocol, and the second clock frequency used when the circuit is configured to perform communication via the second wireless communication protocol.

Preferably, the second clock frequency may be halved of the first clock frequency.

Preferably, the transceiver may be configured to adaptively operate between first and second channel frequencies, the first channel frequency used when the circuit is configured to perform communication via the first wireless communication protocol, and the second channel frequency used when the circuit is configured to perform communication via the second wireless communication protocol.

Preferably, the first channel frequency may include a frequency specified by the IEEE 802.11a protocol, and second channel frequency includes a frequency specified by the IEEE 802.11p protocol.

According to a $2^{nd}$ aspect of the invention, there is provided a mobile computing device comprising the integrated circuit based on the $1^{st}$ aspect.

Preferably, the computing device may include a smartphone.

According to a $3^{rd}$ aspect of the invention, there is provided an integrated circuit adapted for mobile communication, comprising: a first circuit portion arranged to perform communication via first and second wireless communication protocols; and a second circuit portion arranged to perform communication in conjunction with the first circuit portion via the first and second wireless communication protocols, wherein the first and second circuit portions are electrically coupled to enable the mobile communication using the first and second wireless communication protocols.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which:

FIGS. 2a to 2d, shows the LEES process integration of an III-V substrate and a CMOS substrate, according to the prior art;

FIG. 8 shows a diagram of a FPGA system used to facilitate implementation of the integrated circuit of FIG. 4 for performance evaluations;

FIG. 9 shows a diagram of an 802.11p Airblue Transmission (TX) Pipeline;

FIG. 10 is a table listing parameters of functions of a packet generator used in the performance evaluations for the integrated circuit of FIG. 4;

FIGS. 11a and 11b respectively show effects on frequency spectrum output at the DAC module of the FPGA system of FIG. 8 without/with using a low pass filter, whereas FIG. 11c shows the corresponding effects in the time-domain;

FIGS. 12a to 12c show evaluation results relating to SSB rejection for the first circuit portion of the integrated circuit of FIG. 4, whereas FIG. 12d shows an output spectrum of the second circuit portion of the integrated circuit of FIG. 4;

FIG. 15a is a map of geographic areas where the RoadRunner application is deployed for performance evaluations of the system prototype of FIG. 14;

FIG. 15b is a photograph of an 802.11p DSRC radio coupled to an Android™ smartphone used in the performance evaluations setting of FIG. 15a;

FIG. 15c shows corresponding performance results relating to average power consumption of the RoadRunner V2V token exchanges with/without adaptive power control;

DETAILED DESCRIPTION OF PREFERRED EMBODIMENTS

1. Introduction

Figure 4:
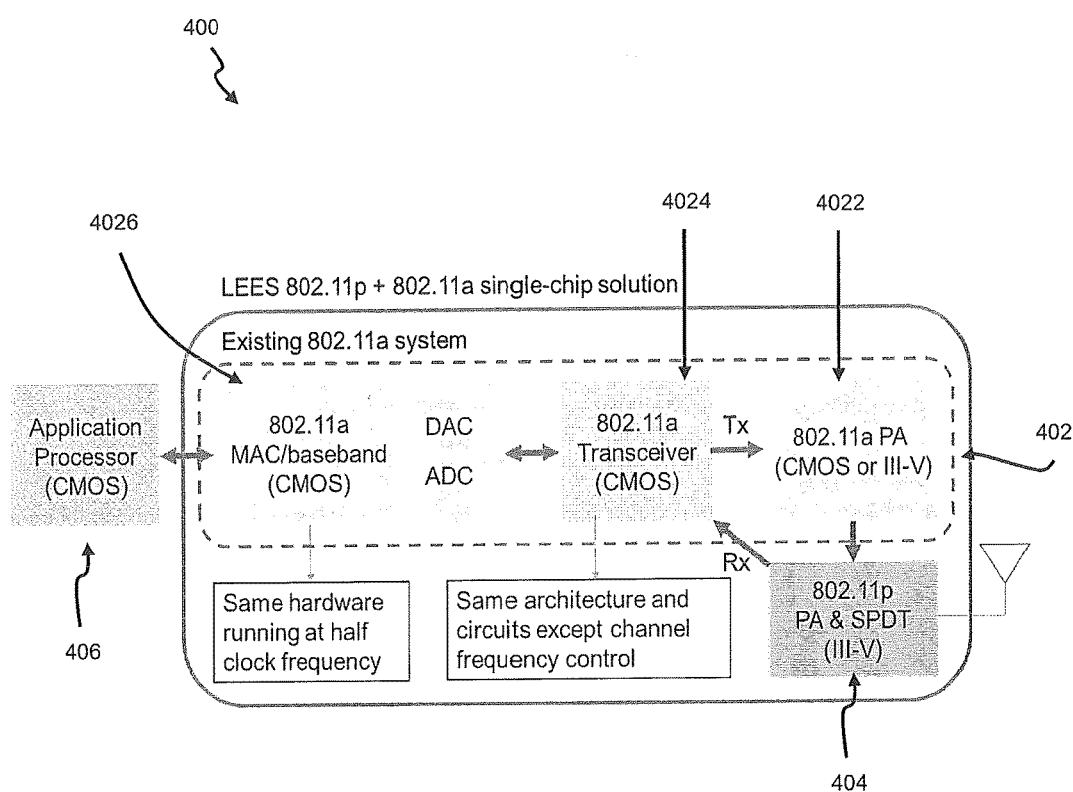
FIG. 4 is a block diagram of an integrated circuit adapted for mobile communication, according to an embodiment.

Referring first to FIG. 4, a diagram of an integrated circuit 400 adapted for mobile communication (according to an embodiment), which comprises first and second device layers (not shown), being formed from first and second semiconductor materials respectively. The first and second device layers respectively include first and second circuit portions 402, 404, as depicted in FIG. 4. For ease of illustration, the first and second circuit portions 402, 404 are shown laid out separately in FIG. 4: The first circuit portion 402 includes an RF transmitter, while the second circuit portion 404 includes at least a GaN power amplifier (PA). Specifically, the first circuit portion 402 is configured to perform communication using first and second wireless communication protocol, while the second circuit portion 404 is configured to perform communication (in conjunction with the first circuit portion 402) using the first and second wireless communication protocols. That is, to clarify, the first and second circuit portions 402, 404 may be configured to together carry out communication via the first or second wireless communication protocol (to be elaborated further below). The first and second wireless communication protocols are selected from the IEEE 802.11 family of protocol, but not to be construed as limiting. In this case, the first and second wireless communication protocols are the IEEE 802.11a and 802.11p protocols respectively (and will be referred to as such hereinafter). Also, the first and second device layers are integrally formed and the first circuit portion 402 is electrically coupled to the second circuit portion 404 to enable the mobile communication (by the integrated circuit 400) using the first and second wireless communication protocols. The definition of "integrally formed" here means monolithically formed from a single die. In addition, the first and second device layers are formed on respective disjointed planes. This is so because the first and second device layers are collectively formed (in different stages) from a single die as afore explained. For example, the plane of the first device layer may overlay the plane of the second device layer. Specifically, the integrated circuit 400 is formed as a single processor (i.e. a chip) or as an integrated portion of a processor. The first semiconductor material includes a silicon-based material (or a material different to silicon), and in this instance, CMOS is used as an example. The second semiconductor material includes an III-V material, and gallium nitride (GaN) is used as an example in this embodiment. Other III-V materials include GaAs, AlGaAs or InGaAs. The PA is realised using the III-V material (e.g. GaN) because III-V devices are known for maintaining high efficiency at lower output power, which is beneficial for implementing chips used on mobile devices to carry out 802.11p communication (which requires high power consumption). Particularly, the feasibility of realizing the 802.11p protocol on mobile computing devices (e.g. smartphones) is achieved by bringing together materials, devices, circuits, and systems researchers. This development consequently opens up D2D communications to a wider class of applications, so as to enable mobile devices of pedestrians, passengers, and drivers being interconnected at low latency and high bandwidth, allowing highly interactive mobile applications.

Figure 1:
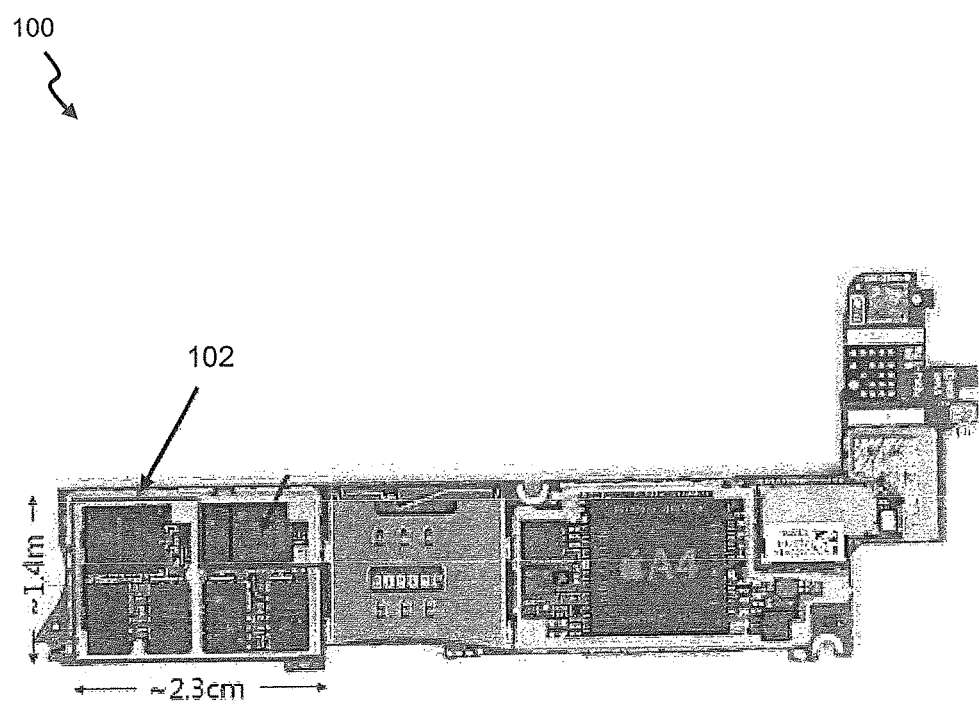
FIG. 1 is a photograph of the RF front-end modules (FEMs) of an Apple™ iPhone 4, according to the prior art.

Among several building blocks for a communications system, the RF front-end is one of the most critical, with III-V semiconductor devices (e.g. GaN, GaAs, InGaAs) showing better power density and efficiency than CMOS-based devices. FIG. 1 is a photograph of multiple RF front-end modules (FEMs) 102 for enabling a variety of communication standards in an Apple™ iPhone 4 (according to prior art); together, the FEMs 102 occupy a large portion of die area of the iPhone 4.

In addition, each FEM 102 includes multiple semiconductor dies therewithin, further undesirably increasing an area footprint, power, as well as cost.

In this embodiment, a process known as the LEES (Low Energy Electronics Systems) process is leveraged, where both CMOS and III-V semiconductor devices are fabricated on a single die, to form the integrated circuit 400 of FIG. 4. Advantageously, the LEES process allows bonding of suitable III-V devices to a conventional CMOS device layer, interfaced via metal interconnects. Such single-die integration offers the superior performance required by the 802.11p specifications at a small form factor and within the tight power budget of a smartphone implementation. In Section 2 below, it will be explained as to how the LEES process is used to shrink the entire integrated circuit 400 having the second device layer (i.e. which is arranged to include an 802.11p RF frontend circuit) and how the second circuit portion 404 is configured to interface with conventional existing communications subsystem circuitry on a smartphone. More specifically, the second device layer is monolithically integrated with the first device layer so that the total die area/footprint of the resulting integrated circuit 400 formed is substantially smaller compared to integrating the two (first and second) device layers using conventional solutions.

Figure 14:
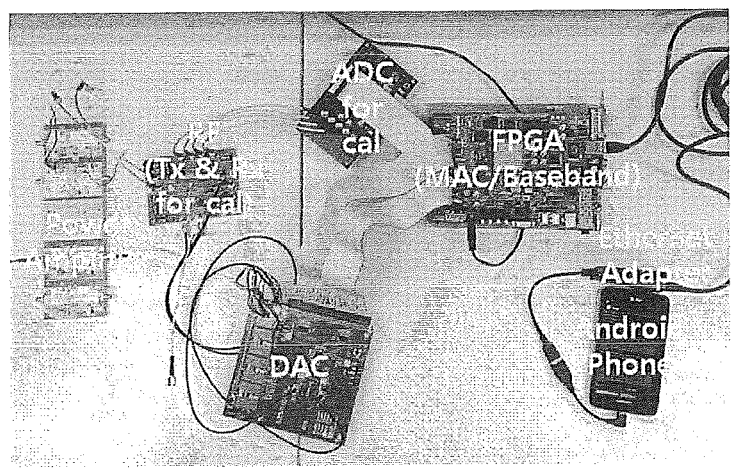
FIG. 14 is a photograph of a system prototype that incorporates the integrated circuit of FIG. 4.

It is to be appreciated that the LEES devices and relevant supporting semiconductor processes are being developed in conjunction with a commercial CMOS foundry, targeting to release prototype devices and circuits within the next few years. In parallel, device modelling and p-cell layout for the LEES devices are also in progress to develop a PDK, which is an integrated CMOS and III-V design kit for circuit designers to create innovative circuits using a conventional design flow. To demonstrate chip functionality before the LEES process is introduced commercially, a reference FEM for a system prototype 1400 (based on the integrated circuit 400), as shown in FIG. 14, is designed and fabricated using standard commercial 0.18 μm CMOS and 0.25 μm GaN technologies on separate dies. The reference FEM incorporates a circuit design to realize the high transmit power (i.e. 28.8 dBm, about four times or nineteen times that of WiFi) required by 802.11p, with low power consumption beneficially.

In addition, compatibility with existing smartphones is demonstrated by emulating an 802.11p baseband on a FPGA (using a modified 802.11a baseband processor) and interfacing the FPGA with a fabricated 802.11p transmitter (corresponding as part of the second circuit portion 404 of the integrated circuit 400). Specifically, the system prototype 1400 is arranged as a transmitter chain comprising the designed FEMs in standard CMOS and GaN technologies, a baseband processor in an FPGA board interfaced to a smartphone (e.g. Android-based) through USB, all 802.11p compliant. Application-level adaptive control of the 802.11p transmitter's transmit power is done via a gain control interface enabled by an Android application (installed on the smartphone) to tune the said transmit power (and thus its related power dissipation) to match an actual desired D2D communication distance. The joint hardware-software power optimization enables substantial further power reduction, allowing the system prototype 1400 to meet the aggressive smartphone power budget.

2. Background 2.1 LEES Process and Design Flow

Figure 2:
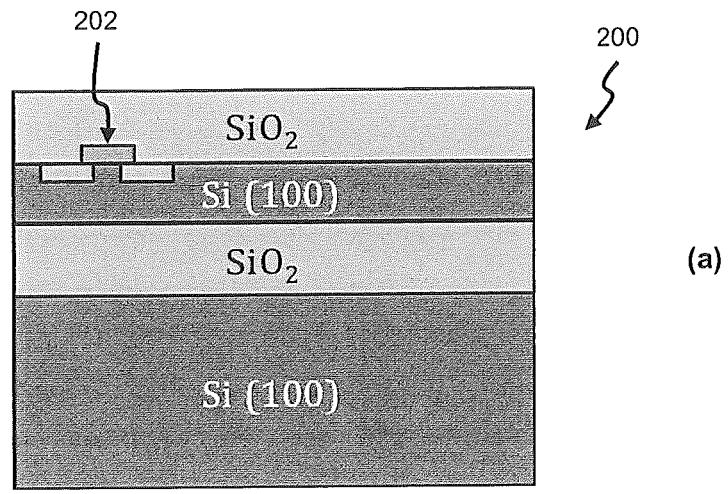
FIG. 2, which includes
Figure 2:
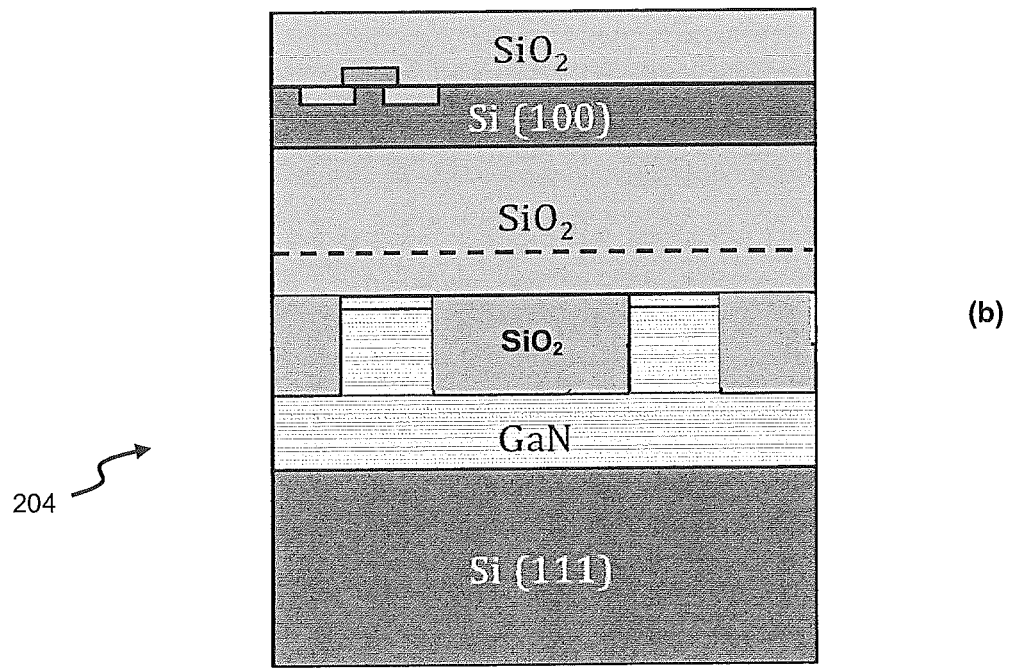
Figure 2:
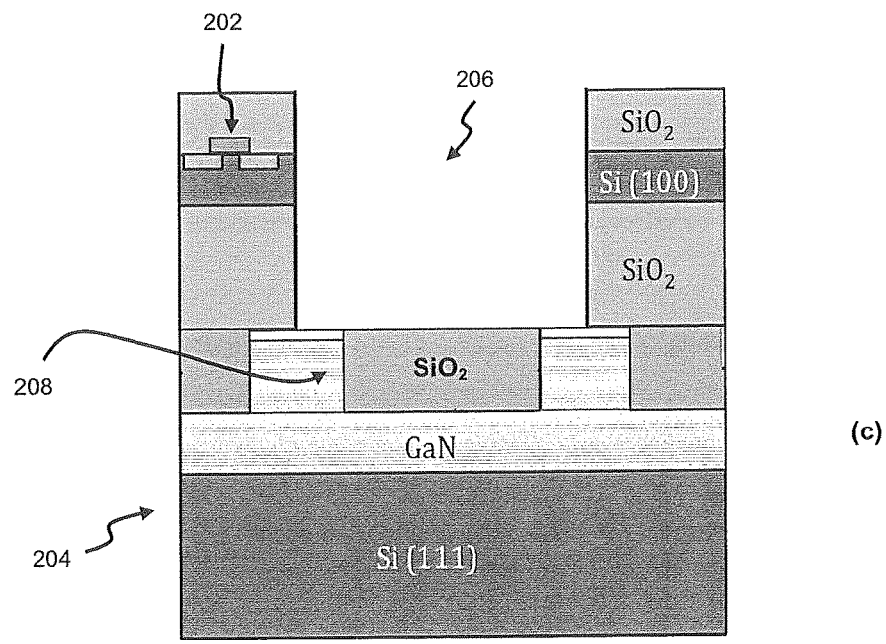
Figure 2:
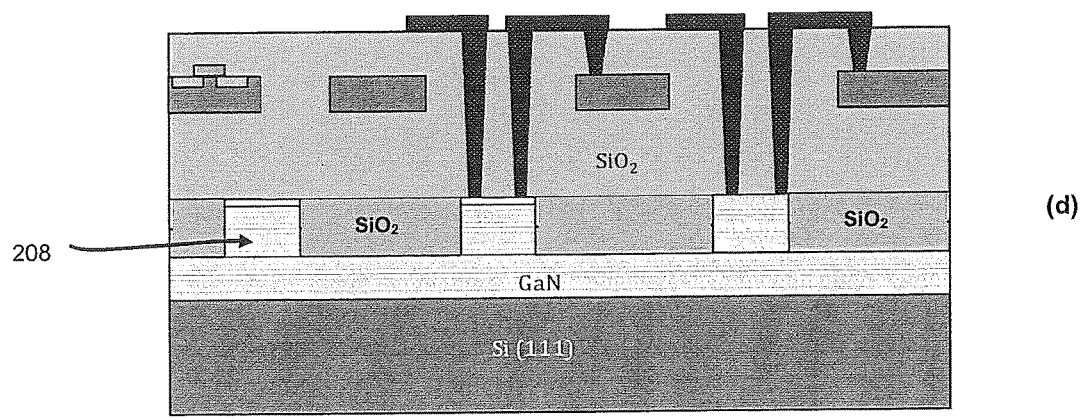

To enable monolithic integration of III-V materials with CMOS, new challenges that are fundamentally different arise for those integrated circuit designs. With this motivation, exploration of new application drivers able to best leverage the monolithic, vertically integrated process was prompted, resulting in the LEES process. Specifically, the LEES process is based on conventional front-end silicon CMOS processing by a commercial foundry, followed by III-V integration and processing in a separate facility, before returning the processed wafer back to the commercial foundry for back-end silicon CMOS processing. FIGS. 2a to 2d collectively illustrate an example structure of III-V monolithically integrated with CMOS/Si devices formed using the LEES process. It is to be appreciated that for this embodiment, GaN HEMTs are used as an example of the III-V semiconductor devices because GaN HEMTs are particularly suitable for forming high-power RF circuits necessary to perform 802.11p communications. Briefly, FIG. 2a shows a silicon-on-insulator (SOI) wafer 200 with fabricated Si-CMOS devices 202 and FIG. 2b depicts a Si-CMOS/GaN-on-Si wafer 204 realized by a two-step bonding technology. FIG. 2c then shows opening of a GaN window 206 for device isolation, and FIG. 2d shows a schematic cross-section view of the monolithically integrated GaN HEMT devices 208 with final metal interconnection of fabricated HEMTs and Si-CMOS devices 208, 202.

As the LEES process is based on a commercial CMOS foundry, CMOS circuit design is able to leverage existing CMOS PDKs provided by the foundry. The III-V portion of a die used, however, requires a new PDK, which includes III-V device models, layout p-cells, and interconnect models between III-V and CMOS devices. The new PDK has been developed with a physics-based compact model of III-V devices (i.e. GaN HEMTs) coupled with device layout, sizing and spacing rules defined by device and process researchers, enabling CMOS with III-V circuit simulation using conventional CAD tools and layout for both the CMOS and GaN portions of the said die. This integrated CAD flow enables joint CMOS with III-V circuit design and eases migration of the LEES process to eventual commercialization.

2.2 Phone Communications Circuits

Conventionally, a communications subsystem of a smartphone incorporates various bi-directional communications radios, including WiFi (i.e. IEEE 802.11a/b/g/n/ac), Bluetooth, and cellular radios (e.g. GSM/CDMA/WiMAX standards). The cellular radios do not support D2D communications and only communicate with cellular base stations that coordinate access to the access medium. WiFi Direct is a recent standard that allows D2D communications between smartphones, and enables networks with star topologies, but not mesh or full peer-to-peer topologies. Ad-hoc WiFi is a pre-existing standard that allows for direct D2D communication without need to appoint one device as a centralized controller/an access point, but is not widely supported among major mobile operating systems, and thus requires kernel modifications. It is to be appreciated that WiFi Direct is implemented using the same hardware (using an analog frontend, PHY, and MAC) as Ad-hoc WiFi, and eases setup of client-AP connections by designating one device as the access point and other devices (in the group) as clients.

Each communication radio typically contains implementation of a PHY (i.e. physical layer) and MAC (i.e. medium access control) in hardware, with upper MAC and higher networking layers implemented in software at the device driver, operating system and application level. The PHY is responsible for handling RF transmission, and modulation and coding schemes, while the MAC is responsible for coordinating multiple devices' access to a shared wireless medium. Thus, a design for the MAC determines whether a network needs a base station or an access point, or whether multiple devices are able to communicate peer-to-peer in a distributed manner with no centralized controller arbitrating access to the wireless medium.

Figures 3A, 3B:
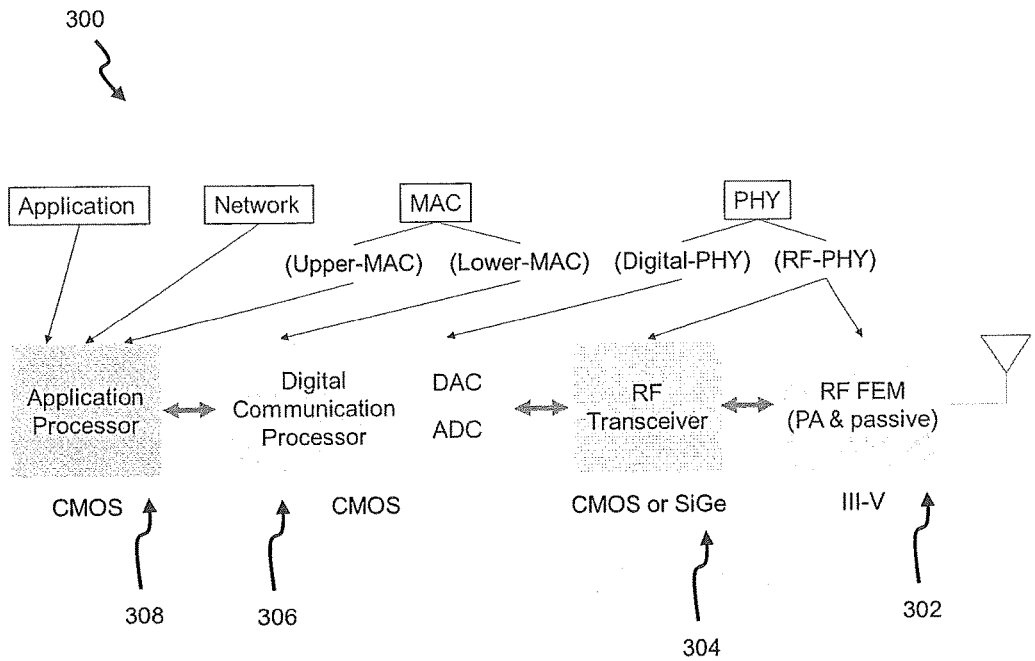
FIG. 3a is a block diagram of a communications circuitry for a typical mobile phone, according to the prior art.
FIG. 3b is a table listing specification parameters of the IEEE 802.11p and 802.11a protocols.

FIG. 3a shows a typical communications circuitry 300 of a conventional smartphone, which includes various hardware modules arranged to handle wireless communications namely: a RF FEM 302, a RF transceiver 304, a digital communication processor 306 (which includes MAC and baseband processing, and an ADC/DAC), and an application processor 308 (where networking and upper-MAC layers and application software are implemented). Most of the hardware modules 302-308 are increasingly integrated with standard CMOS processes, except for the RF FEM 302. While there are on-going circuit researches targeting CMOS power amplifiers to enable higher level of integration of the entire communications circuitry, the intrinsic low power density and efficiency of current CMOS devices however presents challenges. As shown in FIG. 1, a power amplifier used for carrying out each communication standard is still a separate chip fabricated using III-V technology which enables higher output power and efficiency, but worsens overall system form factor. Accordingly, it is to be appreciated that the RF FEM 302 and RF transceiver 304 may benefit by being fabricated using an III-V semiconductor material to obtain better power density and efficiency than being formed using CMOS.

The LEES process advantageously enables improved reduction in a form-factor of the integrated circuit 400 to be achieved by substantially removing bond-wires and bonding pads between the silicon and III-V dies. The LEES process attains improved performance by avoiding interconnect parasitic inductance and capacitance at RF frequency. Since the die area occupied by RF FEMs 102 in a smartphone is not negligible (i.e. see FIG. 1), the high level of integration provided by the LEES process enables a smaller form-factor mobile device and also frees up die area in the motherboard for embedding further functionalities if required. Besides the small form-factor, the power dissipation issue is also carefully addressed for the integrated circuit 400 because all mobile devices tend to suffer from finite electrical energy reserves in batteries (which is why most smartphones are arranged with a separate power management/control chipset). By using the LEES process, an III-V power amplifier is implementable with CMOS control circuitry in a single die, enabling more efficient hardware-level power control combined with application-level management to extend the battery life.

2.3 802.11p Compatibility with 802.11a

The IEEE 802.11p DSRC is originally proposed for vehicle-to-vehicle (V2V) and vehicle-to-infrastructure (V2I) communication, enabling truly distributed mesh D2D networking such as Ad-hoc WiFi. FIG. 3b is a table 350 comparing specification parameters of 802.11p and 802.11a. As seen from the table 350, 802.11p adopts the same OFDM modulation as 802.11a, but its time domain parameters are double those of 802.11a to mitigate highly mobile and severe fading vehicular environments. In addition, 802.11p specifies a guard bandwidth of 156 kHz (vs. 312 kHz in 802.11a) to avoid Doppler spread effect (i.e. inter-carrier interference, ICI) and the associated guard interval is 1.6 µs (vs. 0.8 µs in 802.11a) to mitigate multi-path fading (i.e. inter-symbol interference, ISI). Thus, when a digital baseband processor is implemented for 802.11p, hardware for 802.11a is usable as-is, but configured to execute at half the original clock frequency (to be elaborated below).

With increased transmit power and robustness necessary for longer range V2V communication, the high power consumption of 802.11p radios have conventionally precluded their usage in smartphones. This issue is addressed via the LEES process through the advantageous CMOS/III-V integration that optimizes high power density III-V devices' performance for specific applications and integrates the III-V devices with CMOS on a single die. The LEES process combined with a proposed circuit design, along with adaptive gain control from related application software to be used, thus enables possible implementation of a low-power and small form-factor 802.11p-based D2D solution in a smartphone.

As mentioned, FIG. 4 shows the integrated circuit 400 comprising the second circuit portion 404 and the first circuit portion 402, in which the second circuit portion 404 includes an 802.11p RF frontend circuit and a SPDT (a single-pole-double-throw) switch. It is to be appreciated that in certain instances, the second circuit portion 404 may also include an LNA to improve receiver performance. Accordingly, the 802.11p RF frontend circuit is configured to operate with a clock frequency and a channel frequency specified by the IEEE 802.11p protocol. The 802.11p RF frontend circuit itself includes a GaN PA, and GaN is selected as a material of choice because GaN is suitable for implementing a high power and higher efficiency PA. Hereinafter, reference to the 802.11p RF frontend circuit may refer to the second circuit portion 404 for simplicity. It is to be appreciated that the first circuit portion 402 simply includes existing WiFi chipset and application processor on a smartphone (utilising the integrated circuit 400). The first circuit portion 402 is based on the model of the communications circuitry 300 of FIG. 3a. So the first circuit portion 402 comprises (at least) an 802.11a PA 4022, an 802.11a transceiver 4024, and an 802.11 MAC/baseband processor 4026 (which is arranged to communicate with an application processor 406). The 802.11a transceiver 4024 is configured to be communicably coupled to the second circuit portion 404. It is to be appreciated that the 802.11a PA 4022 may be fabricated using CMOS or III-V materials, while the 802.11a transceiver 4024 and 802.11 MAC/baseband processor 4026 are fabricated using CMOS. This thus means that the 802.11a PA 4022 may be formed either in the first device layer (i.e. made of CMOS in this case) or second device layer (i.e. made of an III-V material in this case), depending on requirements of the integrated circuit 400. But for discussion sake in this embodiment, the 802.11a PA 4022 is taken to be formed in the first device layer (and not to be construed as limiting).

The 802.11 MAC/baseband processor 4026 is configured to adaptively operate between first and second clock frequencies, the first clock frequency used when the integrated circuit 400 is configured to perform communication via the first wireless communication protocol (i.e. IEEE 802.11a protocol), and the second clock frequency used when the integrated circuit 400 is configured to perform communication via the second wireless communication protocol (i.e. IEEE 802.11p protocol). In particular, the second clock frequency is configured to be halved of the first clock frequency. It is to be appreciated that for the first circuit portion 402 to perform 802.11a communication, an antenna switch (i.e. SPDT switch) is required to access an antenna (which is arranged to be shared between the first and second circuit portions 402, 404 in this embodiment and) arranged at the second circuit portion 404. That is, for the integrated circuit 400 to perform 802.11a communication, the first circuit portion 402 is configured to work together with at least the SPDT switch of the second circuit portion 404 to carry out the required communication. Of course, in embodiments where the 802.11a PA 4022 is instead formed at the second device layer, then first circuit portion 402 is also configured to work with the 802.11a PA 4022 (located in the second device layer) for the 802.11a communication. So with reference to FIG. 4, the 802.11a PA 4022 (which is an RF amplifier), 802.11a transceiver 4024, 802.11 MAC/baseband processor 4026, and the SPDT switch (of second circuit portion 404) are required to carry out the 802.11a communication.

On the other hand, for the integrated circuit 400 to perform 802.11p communication, the first circuit portion 402 is configured to work together with both the 802.11p RF frontend circuit and SPDT switch of the second circuit portion 404 to carry out the necessary communication. Similarly, in embodiments where the 802.11a PA 4022 is instead formed at the second device layer, then first circuit portion 402 is also configured to work with the 802.11a PA 4022 (located in the second device layer) for the 802.11p communication. So with reference to FIG. 4, the 802.11a PA 4022, 802.11a transceiver 4024, 802.11 MAC/baseband processor 4026, and the 802.11p RF frontend circuit and SPDT switch (of second circuit portion 404) are required to carry out the 802.11p communication.

Further, the 802.11a transceiver 4024 is configured to adaptively operate between first and second channel frequencies, the first channel frequency used when the integrated circuit 400 is configured to perform communication via the first wireless communication protocol (i.e. IEEE 802.11a protocol), and the second channel frequency used when the integrated circuit 400 is configured to perform communication via the second wireless communication protocol (i.e. IEEE 802.11p protocol). Of course, the first channel frequency includes a frequency specified by the IEEE 802.11a protocol, and second channel frequency includes a frequency specified by the IEEE 802.11p protocol.

To clarify, the clock frequency and channel frequency at which the 802.11p RF frontend circuit 404 is operated are similar in values to those specified for the second clock frequency and the second channel frequency (as discussed above). It is to be appreciated that 802.11p communication requires the operating clock frequency and channel frequency of the 802.11 MAC/baseband processor 4026 and 802.11a transceiver 4024 to be adjusted because 802.11p communication allows higher output power to be utilised compared to 802.11a communication in the substantially same 5 GHz band (i.e. 5.8 GHz for 802.11a communication versus 5.9 GHz for 802.11p communication).

To also further clarify, the 802.11a PA 4022, 802.11a transceiver 4024, and 802.11 MAC/baseband processor 4026 and SPDT switch are collectively operated to enable the integrated circuit 400 to perform 802.11a communication. On the other hand, the 802.11a PA 4022, 802.11a transceiver 4024, 802.11 MAC/baseband processor 4026, SPDT switch and the 802.11p RF frontend circuit 404 are then collectively operated to enable the integrated circuit 400 to perform 802.11p communication. So for 802.11p communication, the 802.11 MAC/baseband processor 4026 is configured to operate at half the first clock frequency generally used for 802.11a communication, while the 802.11a transceiver 4024 is arranged to operate at the second channel frequency allowing for 802.11p communication. That is, the integrated circuit 400 is adaptively operable to perform 802.11a communication or 802.11p communications, as desired.

3. System Prototype Design

As explained, the system prototype 1400 (i.e. see FIG. 14) is implemented as a transmitter chain comprising (and electrically connected in the following order as per FIG. 8): an Android smartphone 812, a FPGA system 800 and the 802.11p RF frontend circuit 404, enabling 802.11p compliant signal transmission with application level gain control for power saving. A USB-Ethernet adapter is utilised to allow communication between the Android smartphone 812 and the FPGA system 800. To interface a baseband processor on the FPGA system 800 to the 802.11p RF frontend circuit 404, commercial DAC evaluation boards are used to feed analog I/Q signals into the 802.11p RF frontend circuit 404. As aforementioned in Section 2.2, all the digital and ADC/DAC components are sharable with existing WiFi communications circuitry, and the single 802.11p RF frontend circuit 404 may readily support both 802.11a and 802.11p by slightly extending its maximum operating carrier frequency range from 5.875 GHz to 5.925 GHz. To demonstrate the feasibility of 802.11p implementation and associated compatibility with existing WiFi solutions (for taking actual power consumption measurements), (an example of) an RF transmitter 500 (included in the first circuit portion 402) and a GaN PA 502 (for the 802.11p RF frontend circuit 404) are designed and fabricated separately using commercial foundries, and then existing 802.11a IP is leveraged to implement the 802.11p baseband on the FPGA system 800, before interfacing the FPGA system 800 to the Android kernel.

3.1 RF Front-End

Figure 5:
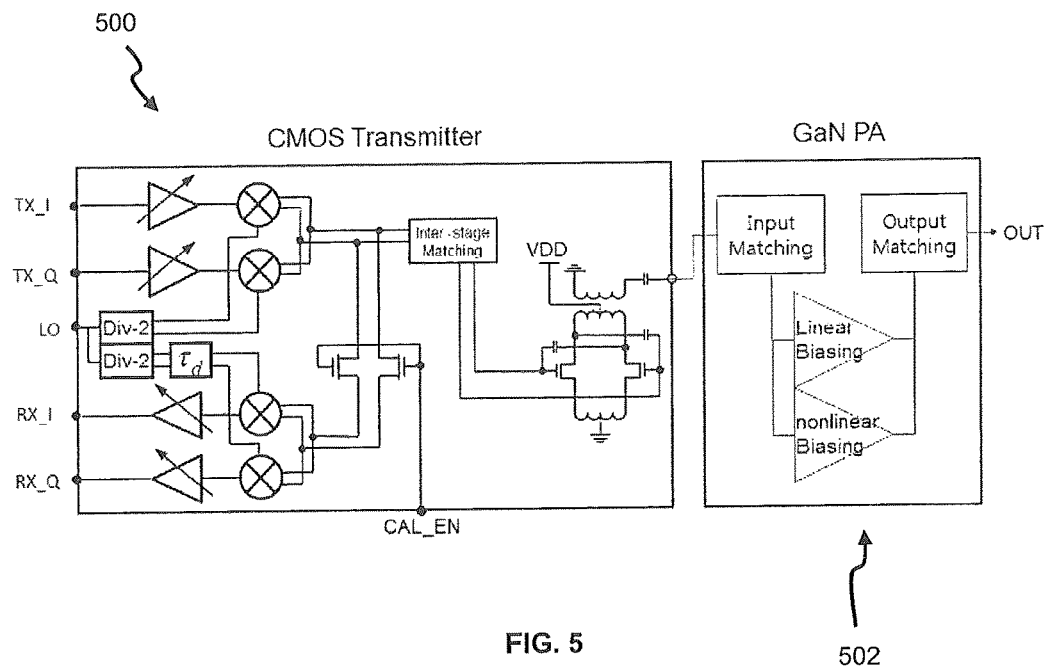
FIG. 5 shows schematics of the integrated circuit of FIG. 4.

FIG. 5 shows schematics of the said RF transmitter 500 and GaN PA 502. It is to be appreciated that the RF transmitter 500 includes circuit portions that are related parts of the 802.11a PA 4022 and 802.11a transceiver 4024 (which is an RF transmitter and an RF receiver combined) respectively. So, a portion of the RF transmitter 500 may either be formed in the first or second device layer, depending on where the 802.11a PA 4022 is formed. That is, the RF transmitter 500 may entirely be formed in the first device layer, or one portion of the RF transmitter 500 may be formed in the first device layer while another portion of the RF transmitter 500 may be formed in the second device layer. The RF receiver is not shown. Specifically, the RF transmitter 500 includes a baseband filter/VGA chain, quadrature mixers, and a driver amplifier. A simple CMOS receiver circuitry (not shown) is also designed for calibration to enhance cross-coupled neutralization capacitors to improve linearity, along with a center-tapped on-chip inductor for source degeneration. A center-tapped on-chip transformer is used to remove need for an external balun circuit.

Figure 7:
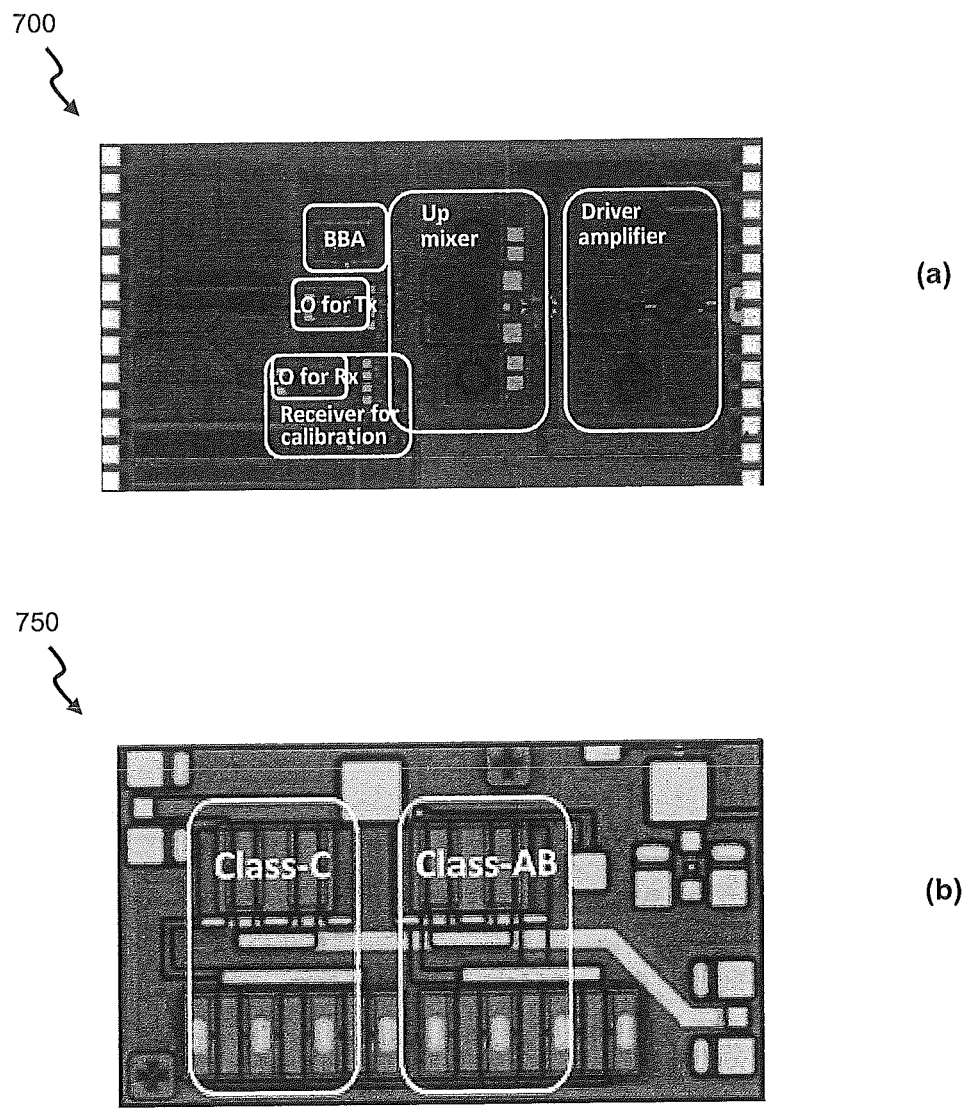
FIG. 7 includes FIGS. 7a and 7b, which show respective microphotographs of fabricated dies of the first and second circuit portions of the integrated circuit of FIG. 4.

The RF transmitter 500 and receiver circuitry are fabricated in 0.18 μm CMOS technology and occupy about 1.4 mm² of die area including a whole transmitter chain and a receiver for I/Q mismatch calibration excluding the pad area, as shown in a microphotograph 700 in FIG. 7a. It is to be appreciated that receiver paths in the RF transmitter 500 are merely for calibration purposes in this instance, and so the RF transmitter 500 is configured as a transmitter which also includes the 802.11a PA 4022 arranged prior to the GaN PA 502. Further it is to be highlighted that the GaN PA 502 shown in FIG. 5 may not entirely represent the 802.11p RF frontend circuit 404 for illustration simplicity, and also since the second circuit portion 404 may include other related circuits such as the SPDT switch (not shown in FIG. 5). The RF transmitter 500 is configured to be used as-is for both 802.11a and 802.11p communications with only necessary channel frequency adjustments required for the specific communication to be effected, which means the 802.11a transceiver 4024 is also sharable for both 802.11a and 802.11p communications.

Figure 6:
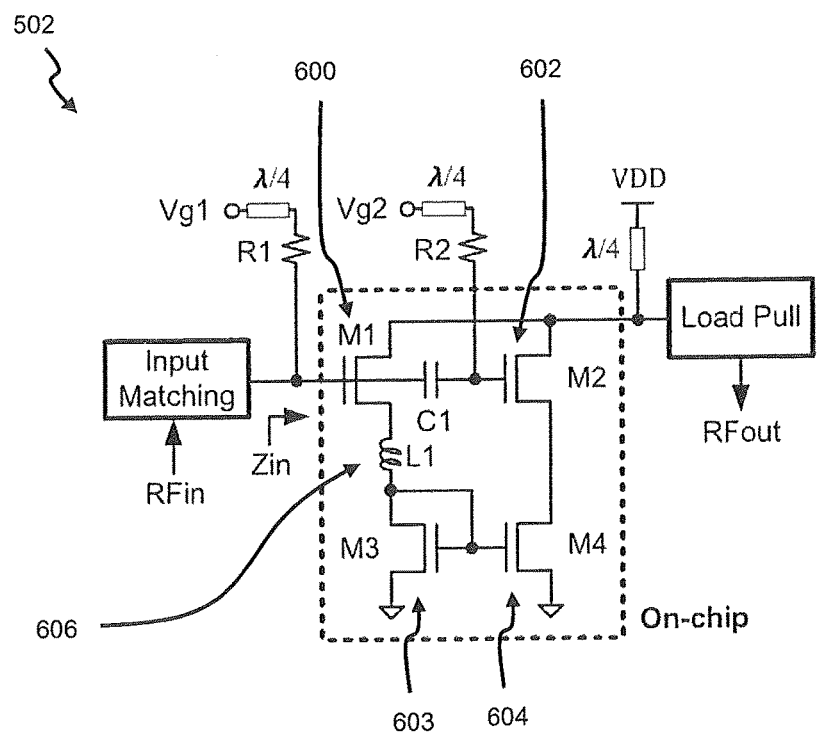
FIG. 6 shows schematics of a second circuit portion of the integrated circuit of FIG. 4.

FIG. 6 shows proposed circuit schematics of the GaN PA 502. To achieve a 28.8 dBm output power satisfying the EVM requirement, a power combining technique is proposed using Class AB and C biasing devices 600, 602 (i.e. labelled as M1 and M2 in FIG. 6, and referred as such hereinafter). The same RF input signal is applied to the transistor gates of M1 600 and M2 602 with different Class C and Class AB DC biasing while directly connecting the transistor drains of M1 600 and M2 602, which substantially reduces complexity of the input and output networks by applying a common load-pull method. Two tail devices 603, 604 (labelled as M3 and M4 in FIG. 6, and referred as such hereinafter), act as a current mirror keeping the two in-phase signals from M1 600 and M2 602 linearly combined due to an inherent linear current relationship between M3 603 and M4 604 in the current mirror. M3 603 and M4 604 are always self-biased in a saturation region regardless of the biasing of M1 600 and M2 602, since GaN HEMTs are depletion mode devices with a negative pinch-off voltage. Thus the GaN PA 502 requires external negative biases. A small inductor 606 (labelled as L1 in FIG. 6 and referred as such hereinafter) is used in the Class-C PA to reduce the input capacitance variation. Also, L1 606 ensures that the two drain voltage waveforms are in-phase, so that the two voltages from M1 600 and M2 602 are combined efficiently at the drain.

For evaluation purposes in this embodiment, the GaN PA 502 is designed and fabricated using a commercial 0.25 μm GaN-on-SiC process. FIG. 7b shows a microphotograph 750 of the fabricated GaN PA 502 occupying about 1.28 mm² of die area (including pads). The fabricated GaN PA 502 is configured to run at about 5.9 GHz. In summary, the proposed GaN PA 502 is able to achieve both linearity and efficiency across output power levels, while eliminate complex design issues faced in traditional power amplifiers.

3.2 FPGA Subsystem

FPGAs provide an ideal platform for prototyping complex radio baseband implementations in real-time, offering high performance, low power, and portability, in comparison with other software radio platforms. The FPGA system 800 performs two functions in the system prototype 1400: baseband processing and provide an interface between an application software installed on the Android smartphone 812 and the analogue/RF circuitry via the DAC 814. The FPGA system 800 is implemented (for example) using a Xilinx XC5VLX110T FPGA on the XUPV5 development board. A complete transmitter chain corresponding to the integrated circuit 400 implemented using the FPGA system 800 is depicted in FIG. 8. The FPGA system 800 includes a LEAP Abstraction layer module 802 communicably coupled to a packet generator 804 and a gain control module 806 in parallel, while the packet generator 804 is coupled to an 802.11p Airblue Wireless Baseband Processor 808 (hereafter Airblue baseband module for brevity) which is in turn coupled to a digital low pass filter 810. The Android smartphone 812 is coupled to the LEAP Abstraction layer module 802 (via Ethernet). The low pass filter 810 is coupled to an external DAC 814, which is communicably coupled to an RF FEM 816. It is to be appreciated that the RF FEM 816 represents the combination of the 802.11a PA 4022, 802.11a transceiver 4024 and 802.11p RF frontend circuit 404 (of FIG. 4). Data packets are transmitted from the Android smartphone 812, via the RRR Abstraction layer and Ethernet, to the 802.11p Airblue baseband module 808. The resulting baseband output is passed through the low pass filter 810 and scaled before provided to the DAC 814. The low pass filter 810 reduces any noise caused by the sampling effect within the 40 MHz spectrum range. It is to be appreciated that all components 802-814 (except for the RF FEM 816) in FIG. 8 may be mapped to the 802.11 MAC/baseband processor 4026 and application processor 406 of FIG. 4. In the system prototype 1400, an interface needs to be implemented (i.e. the LEAP Abstraction layer module 802 is implemented in FPGA and the USB-to-Ethernet interface in the Android smartphone 812 is realised via an Android phone) since the overall application is split between an application processor running software on a separate smartphone and the FPGA system 800 performing digital baseband processing. It is to be appreciated that the packet generator 804 is shown as a simple MAC functional block (that is configured within the 802.11 MAC/baseband processor 4026), while the low pass filter 810 configured for waveform/spectrum shaping may be regarded as a part of the baseband functional blocks.

The Airblue baseband module 808 performs required baseband processing, and is discussed in Section 3.2.1. It is to be appreciated that all other modules 802-810 within the FPGA 800 are part of an interface support required to successfully bridge the data transmitted by Android smartphone 812 and actual analogue signals seen by the RF FEM 816. The LEAP Abstraction Layer is discussed in Section 3.2.3 and this layer allows hardware on the FPGA system 800 to be accessed in a systematic way.

The Android smartphone 812 is able to access two functions in the FPGA system 800: the packet generator 804 and gain control module 806. The packet generator 804 is responsible for configuring parameters, buffering, synchronizing and handling baseband transmission. Particularly, the packet generator 804 is configured to buffer data waits until the Android smartphone 812 provides a complete data packet before forwarding the data packet to the Airblue baseband module 808, ensuring proper timing and synchronization for the baseband processing mechanism. The packet generator 804 controls baseband transmission parameters including data transmission rate, OFDM packet header information and back-off (delay) time between transmissions. The packet generator control and a list of functions are discussed at the end of Section 3.2.3. The gain control module 806, allows the Android smartphone 812 to directly configure power settings on the RF FEM 816. The FPGA system 800 receives power control commands from the Android smartphone 812, decodes the received commands and applies appropriate settings to the RF FEM 816 via a parallel pin interface. This control mechanism enables power saving capability to be applied from the application software installed on the Android smartphone 812. Further details regarding an interfacing between the FPGA system 800 and RF FEM 816 are described in Section 3.2.4.

3.2.1 Airblue Wireless Platform

As mentioned, the baseband design used in the system prototype 1400 is the Airblue baseband module 808. The Airblue baseband module 808 is part of WiLIS (based on literature), being a FPGA-based hybrid hardware-software system designed for exploration of wireless system protocols. The software aspect of the Airblue baseband module 808 is written in Bluespec SystemVerilog (hereafter Bluespec), a high-level synthesis language that supports extensive static elaboration and checking, assertions and parameterization enabling the Airblue baseband module 808 to be highly configurable, modular and reusable. Bluespec uses guarded atomic actions (rules) to model hardware behaviourally. Guarded atomic rules also allow efficient and timing-critical hardware generation, as the rules only generate combinational logic unless specified otherwise.

It is to be appreciated that the Airblue baseband module 808 was originally designed to meet the 802.11a standard specification. As a wireless system protocol exploration tool, WiLIS allows customisation of the Airblue baseband module 808 to meet desired requirements of the system prototype 1400 (i.e. in this case to implement the 802.11p standard). Since the 802.11a and 802.11p standards are largely similar except for transmission frequency, the Airblue baseband module 808 is run at half the original clock frequency (i.e. 10 MHz) to achieve compatibility with the 802.11p standard. It is worth noting that for actual 802.11p deployment, more stringent output spectrum shaping is required than for 802.11a. This means that the Airblue baseband module 808 may be arranged to be shared in carrying out both 802.11a and 802.11p communications.

FIG. 9 is a diagram of a data flow of the 802.11p Airblue OFDM transmission (TX) pipeline 900 (hereafter TX pipeline). All stages of the TX pipeline 900 are running at 10 MHz and explicit buffering is configured between each stage. Briefly, a TX controller module 902 processes the OFDM header information comprising a packet length, modulation and transmission rate. The TX controller module 902 generates a control token that is passed through the entire TX pipeline 900 to enable dynamic decisions on the control path to be made along the TX pipeline 900. An IFFT module 904 performs a folded butterfly computation to save area and share hardware resources (e.g. DSP Blocks). A cyclic prefix insertion module 906 receives data output from the IFFT module 904 and appends hard-coded values for the short and long preambles that are placed before the actual output is transmitted.

The Airblue baseband module 808 also exploits Bluespec's parameterization capability to allow arbitrary baseband processing bit-precision and number representation, which beneficially allows for exploration and optimisation of resource utilization and signal quality for the FPGA system 800. The reconfigurable nature of Airblue baseband module 808 also permits configuration of transmission data rate (i.e. 6 Mbps to 54 Mbps) and modulation type (i.e. BPSK, QPSK, 16-QAM, or 64-QAM) to be done at runtime.

3.2.2 FPGA Interface Development

The Asim Architect's Workbench (AWB) is the development environment for the hybrid hardware-software design to implement the integrated circuit 400 via the FPGA. AWB is a performance-modelling infrastructure with plug-and-play characteristics to promote modularity and code reuse. FPGA support is provided in AWB via the Logic-based Environment for Application Programming (LEAP) framework that provides the Remote Request-Response (RRR) framework, which is an abstracted communication layer.

3.2.3 System RRR Abstraction Interface

The Airblue baseband module 808 was originally arranged to be coupled with a high-performance computing platform running a software application and communicating via the PCI Express interface. However, PCI' Express communication does not suit embedded applications including the proposed system prototype 1400 (of FIG. 14) which has strict power constraints. Hence a proposed Gigabit Ethernet interface, with dedicated state machines and buffering for communication with the Android smartphone 812, is used as a replacement. As the Airblue design is tightly coupled to the AWB and LEAP framework, the Ethernet extension was added as part of a new physical channel option in AWB. This approach keeps the RRR framework intact, allowing the FPGA system 800 and Android smartphone 812 to communicate reliably. Consequently, the Android smartphone 812 is able to invoke functions that transfer data to a particular hardware region (i.e. Bluespec function) on the FPGA system 800 via Ethernet. This mechanism enables implementation of the packet generator 804 and gain control module 806 depicted in FIG. 8. Table 1000 depicted in FIG. 10 lists example functions of the packet generator 804 and their respective purposes.

3.2.4 System DAC Interface

Aside from connectivity between the Android smartphone 812 and the Airblue baseband module 808, the FPGA system 800 also interfaces with the RF FEM 816. Compatibility with the DAC specification is important to ensure signal integrity and correctness. Baseband data is scaled to a 10-bit unsigned integer representation; as per the DAC specification, and passed via a parallel pin interface with a clock frequency of 40 MHz.

3.2.5 Low Pass Filter Implementation

Figure 11:
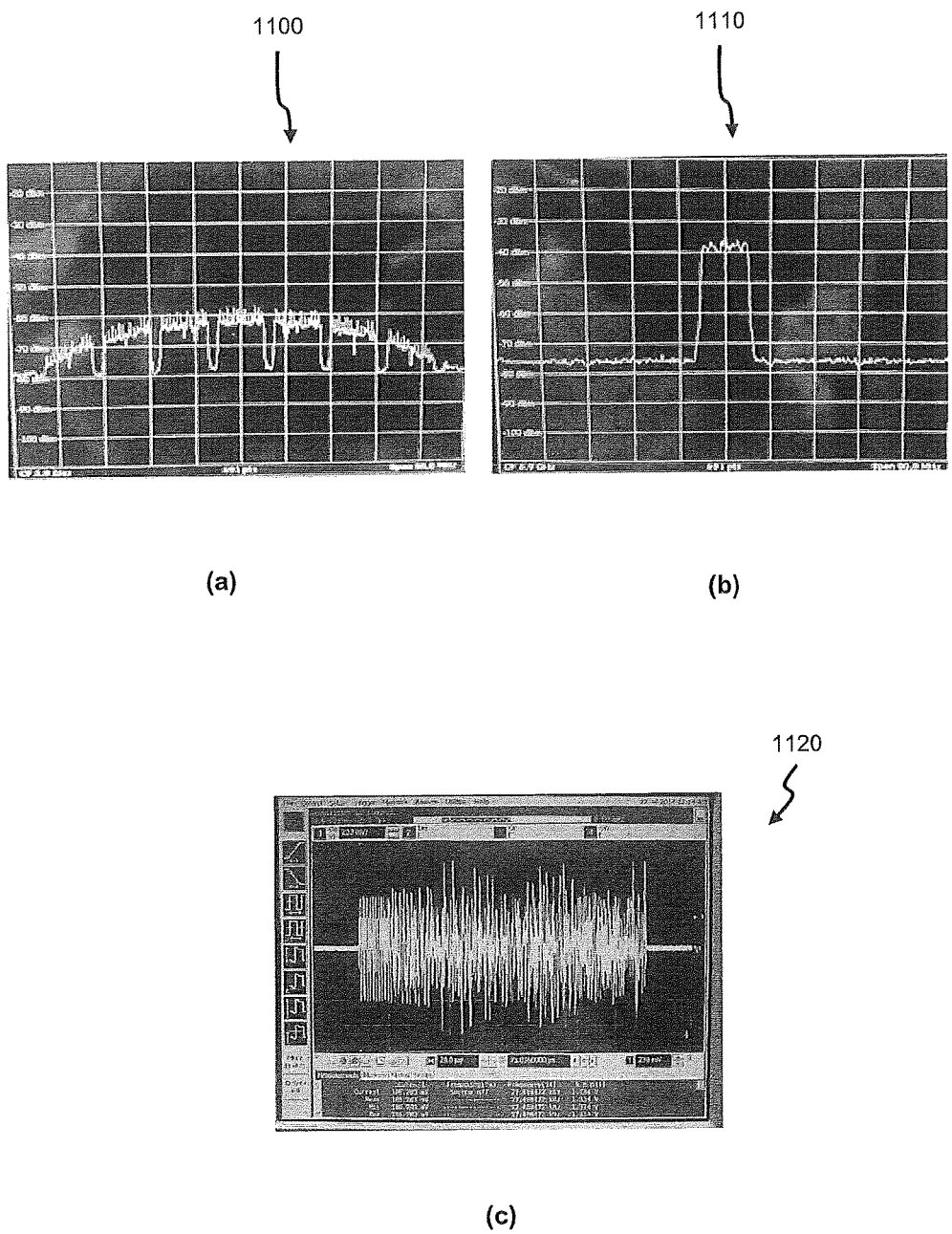

The low pass filter 810 is included and configured to reduce the sampling effects of the Airblue Baseband module 808 within the 40 MHz spectrum range. A fully parallel implementation is infeasible due to a limited number of free DSP blocks available on the FPGA system 800. Hence, a semi-parallel FIR filter running at a multiple times of the sampling clock rate is used to reduce the ratio of DSPs by the same amount. The low pass filter 810 is configured to run at 280 MHz, being about seven times faster than the output sampling rate of 40 MHz, thereby enabling time-multiplexing and resource-sharing of the limited number of available DSP blocks on the FPGA system 800. The proposed semi-parallel filter approach is able to map seventy FIR taps onto a mere ten DSP blocks. FIGS. 11a and 11b are respective diagrams 1100, 1110 showing differences in frequency spectrum prior and subsequent to passing through the low pass filter 810, while FIG. 11c shows another diagram 1120 of the corresponding effects in the time-domain.

3.3 Phone-FPGA Interface

The Android smartphone 812 is interfaced to the FPGA system 800 through the USB-Ethernet adapter connected via Ethernet to the FPGA system 800 and via USB On-the-Go (OTG) to the Android smartphone 812. In order for the Android smartphone 812 to recognise and enumerate the USB-Ethernet adapter, the Linux kernel is recompiled for the Android smartphone 812 to include the USB-Ethernet drivers for the particular ASIX AX88178 and SMSC 7500 chipsets configured in the USB-Ethernet adapter. The recompiled kernel is then loaded onto the Android smartphone 812, replacing the default kernel. This enables the Android smartphone 812 to become a USB-host and recognise the attached USB-Ethernet adapter as a USB-slave via the USB OTG cable.

4. Evaluation

4.1 Circuit Measurements

In order for performance evaluations of stand-alone CMOS and GaN circuits, standard 802.11p OFDM I/Q signals with 10 MHz bandwidth are generated from a vector signal generator which provides quadrature and differential analog baseband signals for the RF transmitter 500 as well as RF complex signals for the GaN PA 502 measurements. For the RF transmitter 500, a −52 dB single-sideband (SSB) rejection is achieved after calibration, as depicted in the evaluation results 1200-1220 of FIGS. 12a-12c. With the same calibration settings and using the IEEE 802.11p baseband I/Q signals, −36.5 dB EVM is then achieved at the transmitter output. As a result of the calibration, EVM is improved as SSB rejection is optimized.

Figure 12:
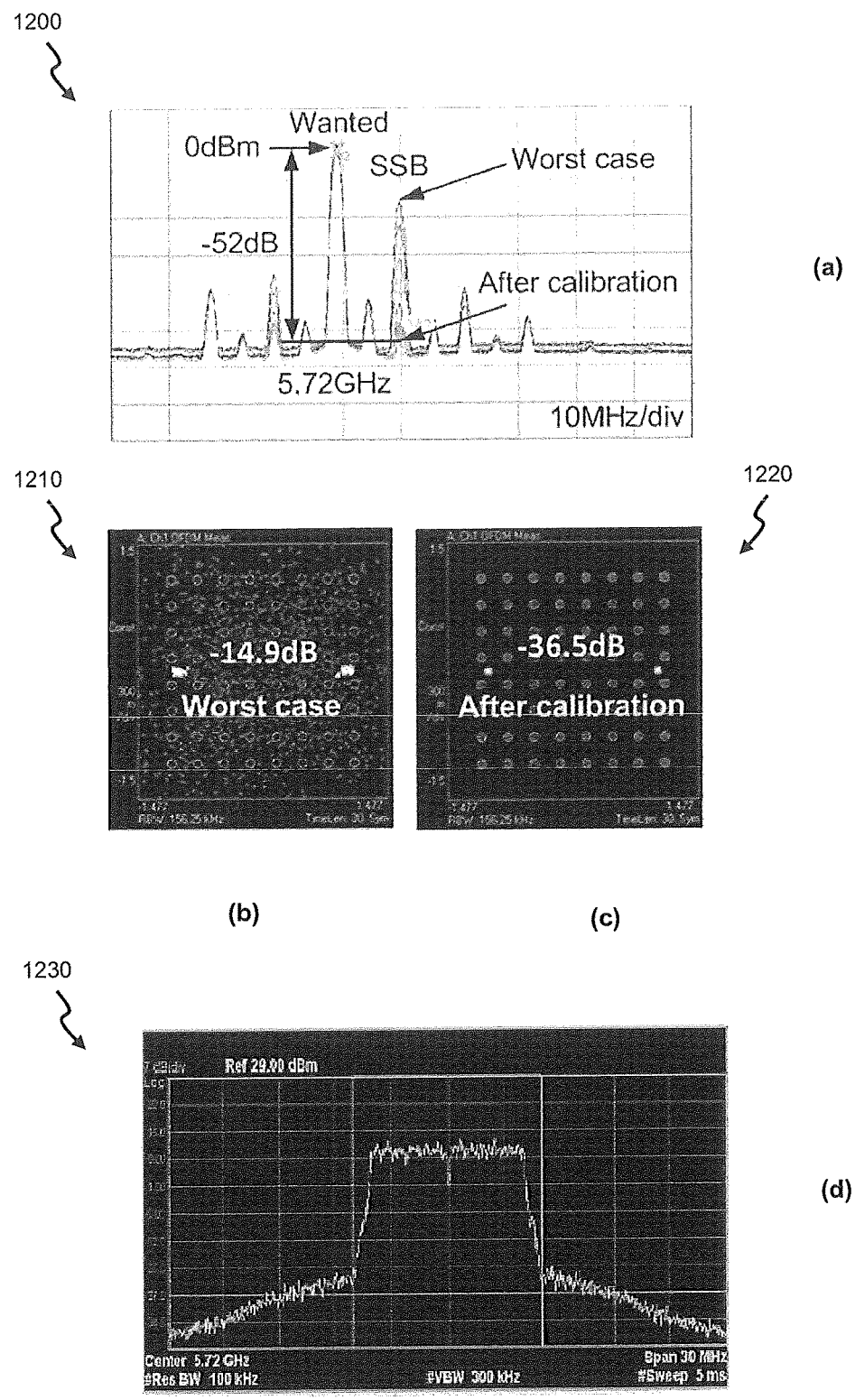

It is to be appreciated that an IEEE802.11p OFDM signal with 10 MHz bandwidth is used for all EVM and efficiency measurements. The GaN PA 502 achieves 30.5 dB EVM and 22% drain efficiency across one-decade output power ranges with a maximum output power of 28.8 dBm. It is to be appreciated that the afore described circuit characteristic is suitable for system level power saving across all output power levels at high efficiency, unlike a conventional PA whose efficiency exponentially decreases as output power drops. FIG. 12d then shows the 28.8 dBm output power spectrum and constellation 1230 using the 802.11p 64-QAM signals, which meets the STA transmit power classification-D.

Figure 13:
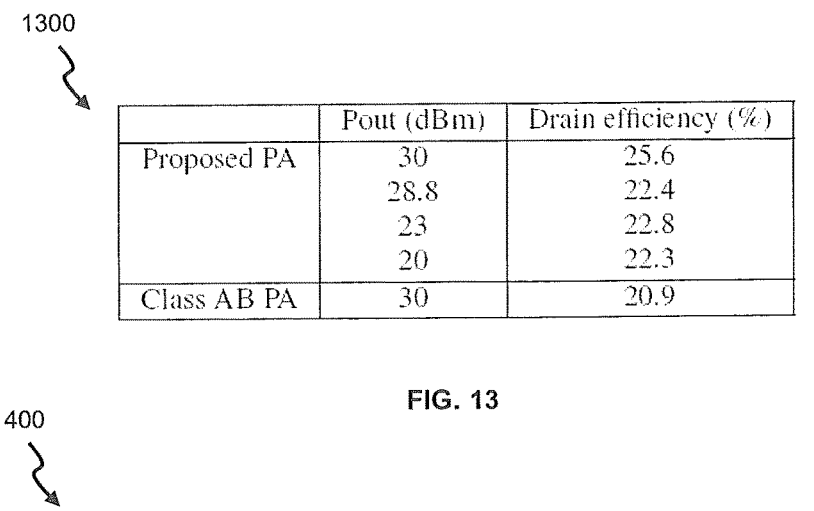
FIG. 13 is a table comparing various performance parameters between conventional Class AB power amplifiers and the second circuit portion of the integrated circuit of FIG. 4.

To satisfy the most stringent class D spectrum mask at more than 5 MHz offset frequencies, digital pre-distortion (DPD) is required. DPD may also further improve the EVM performance. The best combination for the proposed combining is the deep Class AB and the shallow Class C PAs. This is because a shallow Class C PA preserves a certain degree of linearity with improved efficiency. Accordingly, FIG. 13 is a table 1300 comparing various performance parameters between conventional Class AB power amplifiers and the GaN PA 502 (as part of the integrated circuit 400 of FIG. 4), illustrating that the GaN PA 502 is able to achieve higher efficiency at the back-off output power while meeting the EVM requirement, compared to a conventional Class AB PA with the same sized devices. Table 1300 of FIG. 13 also shows that the GaN PA 502 is still able to maintain high efficiency at lower output power. Considering that a PA usually operates at a lower power than the maximum power, system designers may thus benefit from the GaN PA 502, adapting transmit power to application demands. Such a circuit characteristic is suitable for system level power saving across all output power levels at high efficiency, unlike a conventional PA whose efficiency exponentially decreases as output power drops. Although the supply voltage increases to 30 V with conventional commercial 0.25 μm GaN process, it will be compatible with CMOS supply voltage as the device size scales down in LEES process, and so an appropriate DC-DC converter may be designed to control the supply voltage of the GaN PA 502.

4.2 System Prototype Evaluation

As afore set out, FIG. 14 shows a setup of the proposed system prototype 1400, which clearly illustrates that the Android smartphone 812, the FPGA system 800 and commercial DAC evaluation boards are interfaced to respective PCB boards of the RF transmitter 500 and GaN PA 502 (to collectively simulate the integrated circuit 400 of FIG. 4). An 802.11p compliant digital baseband implemented (for example) in a Virtex-5 FPGA along with a TI dual 12-bit DAC, DAC2902, sampling at 40 MHz, feeds the analog I/Q baseband signals into the RF transmitter 500. An Android application installed on the Android smartphone 812 controls packet generation/transmission and RF gain.

Since the transmit mode dominates power consumption, an entire transmitter chain is designed and implemented to validate the LEES process feasibility as well as potential power reduction through application level adaptive power control (ALAPC). Also, the DC power of the GaN PA 502 is more than 90% of the whole transmitter power with a complex modulation scheme like OFDM in 802.11p, since the GaN PA 502 requires back-off due to its high PAPR signals and hence power efficiency is dramatically reduced as output power decreases from a saturation point. Thus, power management of the GaN PA 502 is important to fit the 802.11p RF FEM within a smartphone's stringent power budget.

In the following subsections below, it is determined that ALAPC, combined with improved power efficiency of the GaN PA 502 across all output power levels, may achieve significant power reductions. At the moment, the system prototype 1400 is not yet deployed due to its complex system configuration, coupled with usage of separate FPGA and DAC boards, and multiple power supplies for the transmitter and PA boards. However, traces from prior deployments of two mobile applications (i.e. RoadRunner and SignalGuru) which originally adopt off-the-shelf D2D communications, are used to estimate potential system power savings that are achievable if the COTS D2D radios are replaced with the proposed integrated circuit 400 of FIG. 4.

4.2.1 RoadRunner Evaluation

RoadRunner is an in-vehicle Android application for road congestion control, and provides turn-by-turn navigation instructions to a driver, like existing navigation systems while enforcing road-space rationing by allocating tokens among vehicles in the background. Tokens permit a vehicle to drive on a specific road segment, and are distributed to vehicles from a server over a cellular network (LTE), or exchanged directly between vehicles over 802.11p DSRC.

Original Deployment—

Figure 15:
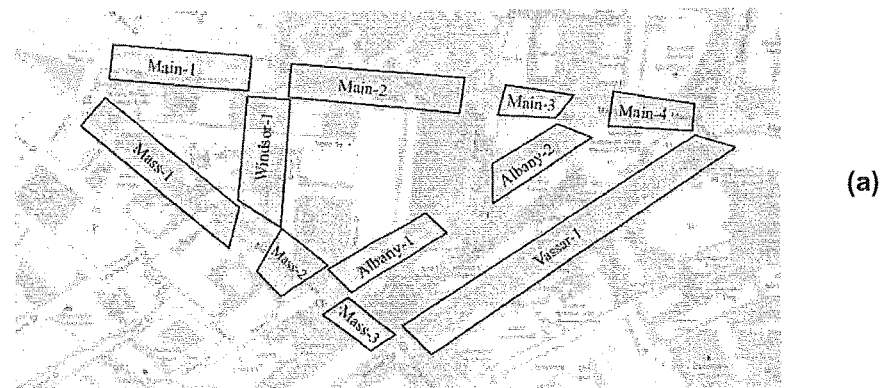
Figure 15:
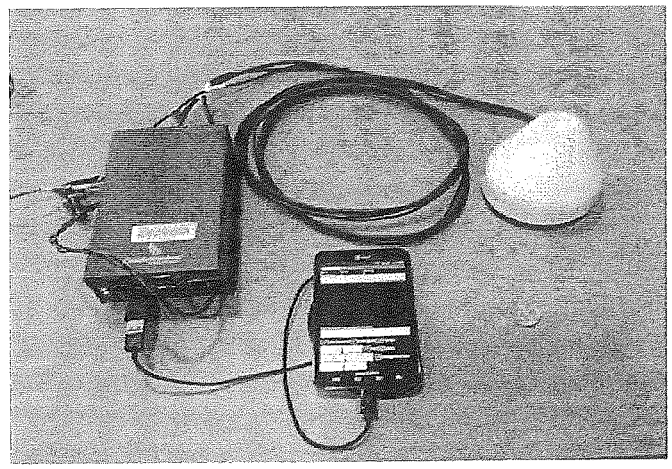
Figure 15:
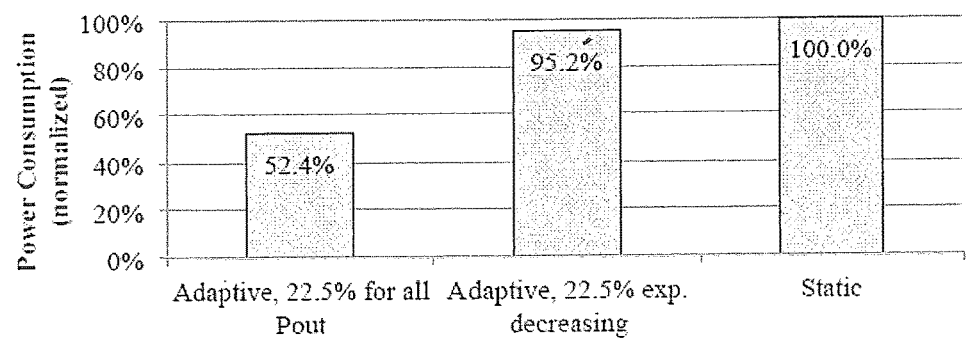

The original deployment took place in various geographic areas in Cambridge, Mass., USA (i.e. see map 1500 of FIG. 15a). The deployment uses ten vehicles driving among multiple possible congestion-controlled routes, some of which required a series of tokens to be acquired by RoadRunner. Three different scenarios were evaluated: RoadRunner using only the cellular network as a baseline; additionally using Ad-hoc WiFi for V2V communications; and additionally using 802.11p DSRC for V2V communications. With 802.11p, each smartphone was tethered via USB to an off-the-shelf 802.11p DSRC radio (as shown in photograph 1510 of FIG. 15b). Each smartphone is enumerated to the associated 802.11p DSRC radio as a USB Ethernet adapter via USB Tethering, and each 802.11p DSRC radio includes an application processor running a bridge application that forwards packets between the Ethernet interface to the smartphone and the wireless DSRC interface.

Using 802.11p enabled network response time improvements of up to 80% versus the cellular network, and cellular network usage reductions of up to 84% were obtained. Ad-hoc WiFi's performance did not suffice: with Ad-hoc WiFi, only five V2V communications sessions occurred at an average distance of 29.2 meters, resulting in only 6.8% of requests being offloaded to V2V from the cellular network, while with 802.11p, forty-seven V2V sessions occurred at an average distance of 175.7 meters, offloading 43% of requests. This original deployment thus motivates use of 802.11p as a mobile D2D communication standard for smartphones, while the cumbersome setup tethering a COTS 802.11p radio to a smartphone desirably motivates usage of the proposed integrated circuit 400 of FIG. 4.

Adaptive Power Control—

RoadRunner traces were obtained and assumed that with adaptive power control, each V2V communications session (i.e. a token exchange) is transmitted at the minimum power required to reach another vehicle. This is compared to the original deployment traces as a baseline, in which every V2V token exchange is conducted at full radio power. The traces include vehicle location, communications on all radio interfaces, and distances at which V2V token exchanges occurred during the deployment. For each V2V exchange, a minimum power level (in mW) to transmit a packet across that exchange distance is looked up from experimental measurements conducted for the GaN PA 502, using 64-QAM coding (see table 1300 of FIG. 13). The sum of the estimates is normalized to a situation with no adaptive power control, as per FIG. 15c, which shows performance results 1520 relating to average power consumption of the RoadRunner V2V token exchanges with/without adaptive power control.

With ALAPC and the proposed integrated circuit 400 (which is able to achieve 22.5% efficiency for all power levels), the V2V exchanges use 47% less power (i.e. reduced from 3.37 W to 1.77 W), indicating that many V2V communications sessions did not need full transmit power in the original deployment to reach another vehicle. With ALAPC alone, and not incorporating the proposed integrated circuit 400 (and so efficiency is exponentially decreasing), V2V token exchanges use only 4.8% less power than the baseline (i.e. reduced from 3.37 W to 3.21 W), underscoring importance of the improved PA efficiency of the proposed integrated circuit 400 in realizing gains from ALAPC.

4.2.2 SignalGuru Evaluation

SignalGuru is a vehicular traffic light detection iPhone application that shares data among multiple smartphones to collaboratively learn traffic signal transition patterns and provide GLOSA (i.e. Green Light Optimal Speed Advisory) to drivers. Each vehicle is arranged with a windshield-mounted iPhone that observes traffic signal transitions via the phone's camera and broadcasts the observations over Ad-hoc WiFi every two seconds.

Original Deployment—

Figure 16:
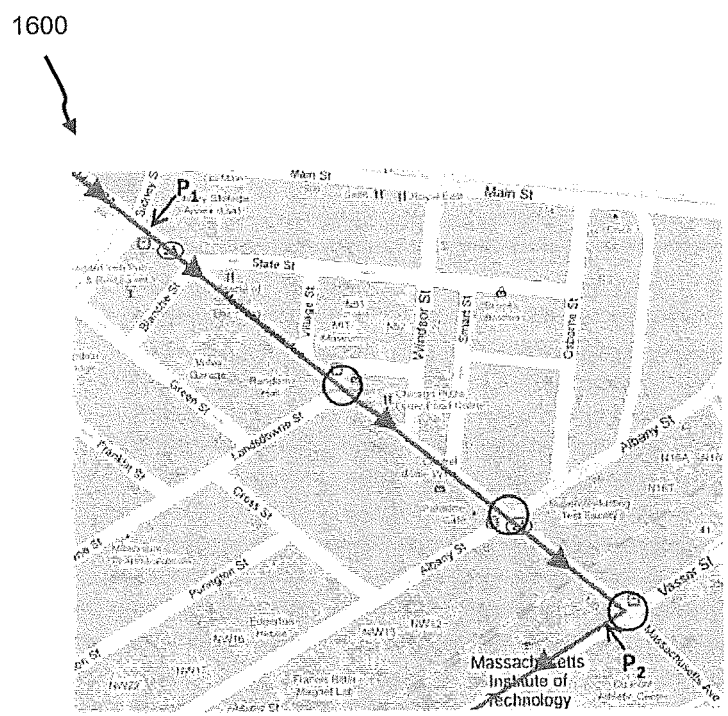
FIG. 16a is a map showing a route in Cambridge, USA, where the SignalGuru iPhone™ application is deployed for performance evaluations of the system prototype of FIG. 14.
FIG. 16b shows corresponding performance results relating to average power consumption of the SignalGuru UDP broadcasts with/without adaptive power control.
Figure 16:
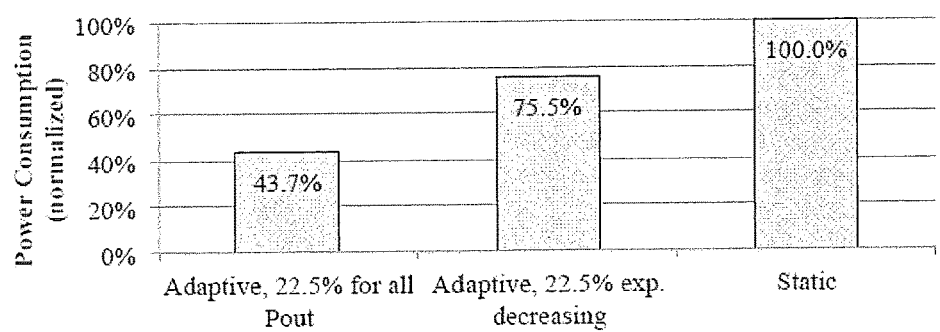

The original SignalGuru deployment also occurred in Cambridge, Mass., USA, along three consecutive intersections on Massachusetts Avenue (i.e. see map 1600 of FIG. 16a). Five vehicles followed a specified route for three hours, generating GPS location traces. To surmount the limited communication range of Ad-hoc WiFi, a phone stationed near an intersection is configured to act as a relay.

Adaptive Power Control—

SignalGuru traces were obtained, and in performance simulations of the proposed integrated circuit 400, whenever a vehicle broadcasts a data packet (e.g. every two seconds), a power level required to reach the next nearest vehicle for transmitting the data packet with ALAPC is calculated, from 19.8 dBm to 28.8 dBm. The calculated power level is compared to baseline static power control, in which every broadcast is transmitted at a maximum power level of 28.8 dBm.

With ALAPC and the proposed integrated circuit 400 (which is able to achieve 22.5% efficiency for all power levels), SignalGuru broadcasts use 56.3% less power (i.e. reduced from 3.37 W to 1.47 W), as per FIG. 16b which shows performance results 1610 relating to average power consumption of the SignalGuru UDP broadcasts with/without adaptive power control. With ALAPC alone, and not incorporating the proposed integrated circuit 400 (and so efficiency is exponentially decreasing), SignalGuru broadcasts use only 24.5% less power than the baseline (i.e. reduced from 3.37 W to 2.54 W), again highlighting the improved power efficiency of the proposed integrated circuit 400 is important to substantially lowering overall system power consumption.

4.2.3 Power Reduction Summary

To put the power reductions of 1.6 W (from RoadRunner) and 1.9 W (from SignalGuru) achieved by the proposed integrated circuit 400 in context, the dynamic range of (for example) a Samsung Galaxy S4 smartphone's power consumption is measured to be about between 1 W (i.e. with the smartphone's screen kept on and put in an idling-mode) and 11 W (i.e. the smartphone is running a CPU-intensive benchmark) using a Monsoon Power Monitor. This indicates a significant power reduction in the overall platform power budget may be realized with the proposed integrated circuit 400.

4.3 Simulations on the New PDK

Figure 17:
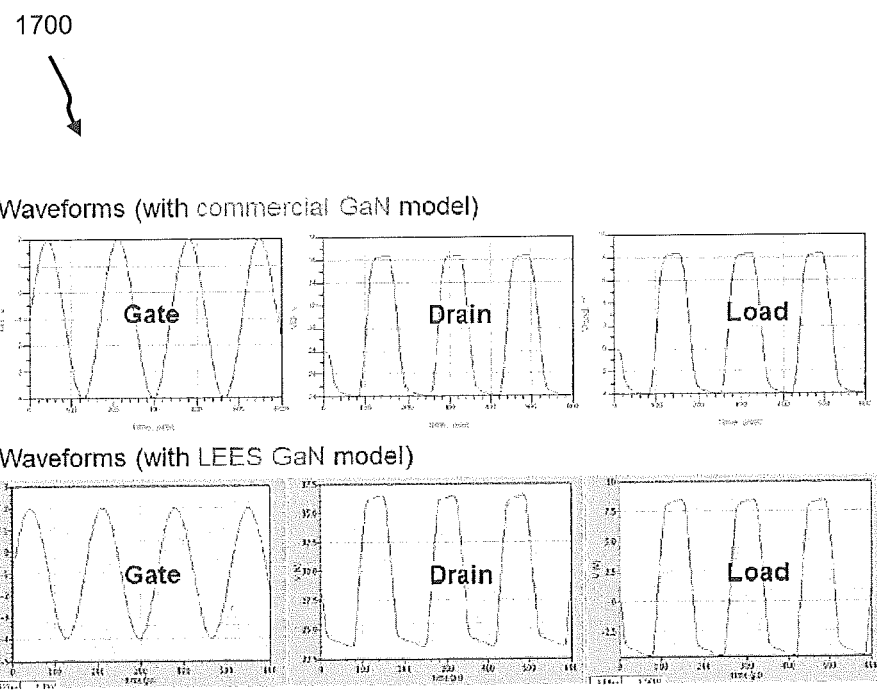
FIG. 17 shows simulation graphs comparing between commercial and LEES GaN models.

To predict and validate circuit functionality and layout area of the proposed integrated circuit 400 (formed using the LEES process), the LEES PDK is used for the simulation and layout of circuits of the prototype system 1400. FIG. 17 shows simulation graphs 1700 comparing the simulation waveforms (carried out at a device level) using the commercial Cree GaN PDK and LEES PDK. Since the PDK includes an unmodified commercial CMOS PDK, only the second circuit portion 404 (i.e. III-V portion) of the integrated circuit 400 is validated. At one terminal of the GaN PA 502 (which has three terminals), the same waveforms at 5.9 GHz are achieved, which means RF parasitics as well as intrinsic AC/DC parameters are successfully reflected in the proposed integrated circuit 400. Large-signal nonlinearity are also investigated through modelling via a physics-based compact model to match the nonlinear characteristics of the GaN PA 502 at high output power, which is essential for predicting accurate performance of the GaN PA 502 (being a III-V (or III-V plus CMOS) PA with CMOS power control circuitry implemented on a single die).

Figure 18:
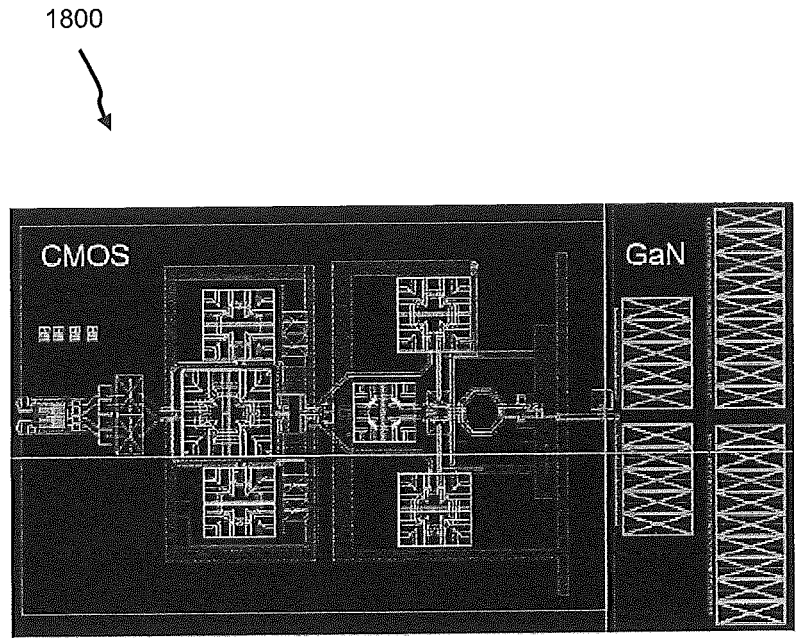
FIG. 18 is a microphotograph of a circuit layout designed using LEES PDK for the integrated circuit of FIG. 4.

FIG. 18 is a microphotograph 1800 of a draft circuit layout designed using the LEES PDK for the integrated circuit 400. Specifically, the RF transmitter 500 is combined with the GaN PA 502 using p-cells in the LEES PDK. Within the GaN active region, although there is no passive component compatible with the corresponding in the commercial PDK, the layout area may fairly be compared with the sum of the existing two separate die area since the high power GaN devices are much larger than the on-chip passives in this case. Compared with the sum of two separate die areas at 1.4 mm$^2$ plus 1.28 mm$^2$ being equal to 2.68 mm$^2$, the combined die area of the integrated circuit 400 using the LEES PDK totals about 1.98 mm$^2$, demonstrating that die integration achieved through the LEES process may further shrink the form factor (as pads are no longer needed). Along with a smaller single die area, the LEES process thus is able to integrate all FEMs and related components currently in a smartphone into a single die or a semiconductor package.

Hence via evaluations of the system prototype 1400 (incorporating the proposed integrated circuit 400), it is shown that 802.11p is effective for D2D deployment for smartphones. Further, simulations of the integrated circuit 400 are performed, in view of the LEES process, using a rigorously modelled process design kit to verify the modelling and process compatibility with conventional commercial CMOS and GaN processes. Compatibility of the proposed integrated circuit 400 with existing smartphones circuitries is also demonstrated by emulating an 802.11p digital baseband on the FPGA system 800 and interfacing the FPGA system 800 with the fabricated 802.11p RF frontend circuit 404. Moreover, the impact of application level power control is shown by interfacing the Android smartphone 812 with the FPGA system 800 and 802.11p RF frontend circuit 404, in which power control is executed via an Android 25, application installed on the Android smartphone 812. Potential application power savings is also demonstrated through two case study applications, vehicular congestion control, and green light optimal speed advisory (GLOSA).

5. Conclusions

In summary, WiFi is unable to effectively handle demands of D2D communication between mobile devices (e.g. smartphones), due to insufficient range and poor reliability. The case for using 802.11p instead is made with the proposed integrated circuit 400. 802.11p is conventionally adopted for V2V communications, providing lower latency and longer range. The integrated circuit 400 is enabled by the LEES process, which is a fabrication process that deposits both III-V and CMOS devices on a single same die (i.e. a GaN-CMOS monolithic process). Specifically, GaN HEMT devices are leveraged to realize the high-power GaN PA 502 necessary for carrying out 802.11p communications, which is in turn coupled to the RF transmitter 500. Also, the proposed 802.11p RF frontend circuit 404 is tailored for adaptive power control, targeting excellent power efficiency across a wide range of transmit power. In the system prototype 1400, the 802.11p RF frontend circuit 404 is interfaced with the RF transmitter 500, the DAC 814 and the FPGA system 800, which is connected to the Android phone 812. Collectively, the 802.11a PA 4022, 802.11a transceiver 4024 and 802.11p RF frontend circuit 404 (or in other words, the RF transmitter 500 and GaN PA 502 together) advantageously consume only 0.13 µJ/bit for transmission across 280 m and 0.02 µJ/bit across 100 m in 64-QAM mode, assuming free space, and meets the 28.8 dBm output power with −30.5 dB EVM measured in the 5 GHz band (i.e. at 5.72 GHz). Application-level power control also enables significant reduction of power consumption of the integrated circuit 400 by about 47% to 56%. This shows that the LEES process is able to realize an 802.11p front-end within the stringent power and area budget constraints of a smartphone.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practicing the claimed invention. For example, the proposed integrated circuit 400 of FIG. 4 may also be deployed in other mobile computing devices (e.g. laptops or tablets), and not limited to smartphones. Also, the integrated circuit 400 may also be used in applications involving low-power in-vehicle units, mobile device-to-device communications for Internet of Things (IoT), Ad-hoc network infrastructure building blocks or the like. In addition, other PAs (formed of suitable III-V materials) may be usable in place of the GaN PA 502 (realised as part of the 802.11p RF frontend circuit 404). Moreover, the second semiconductor material need not necessarily include an III-V material—other suitable materials such as II-VI materials may also be adoptable. Other wireless protocols may alternatively be used in place of the 802.11a and 802.11p protocols, such as for example, future improvements proposed for the 802.11a and 802.11p protocols, or etc. In cases where the 802.11a PA 4022 may be formed in the second device layer, it is to be appreciated that the 802.11a PA 4022 may be implemented as a separate circuit portion independent of the second circuit portion 404, or alternatively the 802.11a PA 4022 may be integrated with the second circuit portion 404.

Moreover, other alternatives in implementing the phone-to-FPGA interface (as described in Section 3.3) may include:

1. Utilising the FPGA system 800 as a USB Host, and the Android smartphone 812 as a USB Slave: this approach eliminates need to modify the Android device's kernel to support the USB-Ethernet adapters, and instead enumerate the Android smartphone 812 as a USB-Ethernet adapter to the FPGA system 800. However, the difficulty lies in programming the FPGA system 800 to act as a USB Host, since a bug in the USB Host chipset on the XUPV5 FPGA development kit was encountered.

2. Utilising the FPGA system 800 as a USB Slave, and the Android smartphone 812 as a USB Host: this approach eliminates need for the intermediate USB-Ethernet adapter, instead connecting the FPGA system 800 as the USB slave directly. This however requires a custom USB device driver to be written for the FPGA application. In any event, using the Ethernet port on the FPGA system 800 and the USB-Ethernet adapter's driver on the Android smartphone 812 appears to be the most straightforward in actual implementation, because existing drivers for the USB-Ethernet adapter may easily be leveraged on the Android smartphone 812, and implementation of a Gigabit Ethernet block on the FPGA system 800 is also well-documented. It is however to be appreciated that the USB-Ethernet adapter may optionally be replaced using other suitable communication interfaces, depending on intended applications.

Yet further according to another variation, there is provided a variant integrated circuit (not shown) having a same system architecture as the integrated circuit 400 of FIG. 4, except that the first and second circuit portions 402, 404 of the variant integrated circuit need not be formed of different respective semiconductor materials. Instead, the first and second circuit portions 402, 404 of the variant integrated circuit may be formed of a same semiconductor material, or different respective semiconductor materials, depending on operating requirements intended for the variant integrated circuit.

The invention claimed is:

1. An integrated circuit adapted for mobile communication, comprising:
    a first device layer formed of a first semiconductor material and having at least a first circuit portion; and
    a second device layer formed of a second semiconductor material different to the first semiconductor material and having at least a second circuit portion,
    wherein the first and second device layers are integrally formed, and the first circuit portion is electrically coupled to the second circuit portion to enable the mobile communication using first and second wireless communication protocols, wherein the first circuit portion further includes a transceiver and a digital baseband processor, and wherein the digital baseband processor is configured to adaptively operate between first and second clock frequencies, the first clock frequency used when the circuit is configured to perform communication via the first wireless communication protocol, and the second clock frequency used when the circuit is configured to perform communication via the second wireless communication protocol.

2. The integrated circuit of claim 1, wherein the first semiconductor material includes a silicon-based material.

3. The integrated circuit of claim 1, wherein the second semiconductor material includes a group III-V material.

4. The integrated circuit of claim 3, wherein the group III-V material includes GaN, GaAs, AlGaAs or InGaAs.

5. The integrated circuit of claim 1, wherein the integrated circuit is integrally formed as a single die or a semiconductor package.

6. The integrated circuit of claim 1, wherein the first and second wireless communication protocols include being selected from the IEEE 802.11 protocol.

7. The integrated circuit of claim 6, wherein the first wireless communication protocol includes the IEEE 802.11a protocol.

8. The integrated circuit of claim 6, wherein the second wireless communication protocol includes the IEEE 802.11p protocol.

9. The integrated circuit of claim 1, wherein the second circuit portion includes a GaN power amplifier and a SPDT.

10. The integrated circuit of claim 9, wherein the GaN power amplifier is formed from GaN HEMTs.

11. The integrated circuit of claim 1, wherein the first circuit portion includes an RF amplifier formed of the first semiconductor material.

12. The integrated circuit of claim 1, wherein the second circuit portion includes an RF amplifier formed of the second semiconductor material.

13. The integrated circuit of claim 9, wherein the GaN power amplifier is configured to operate with a clock frequency and a channel frequency specified by the IEEE 802.11p protocol.

14. The integrated circuit of claim 1, wherein the second clock frequency is halved of the first clock frequency.

15. The integrated circuit of claim 1, wherein the transceiver is configured to adaptively operate between first and second channel frequencies, the first channel frequency used when the circuit is configured to perform communication via the first wireless communication protocol, and the second channel frequency used when the circuit is configured to perform communication via the second wireless communication protocol.

16. The integrated circuit of claim 15, wherein the first channel frequency includes a frequency specified by the IEEE 802.11a protocol, and second channel frequency includes a frequency specified by the IEEE 802.11p protocol.

17. A mobile computing device comprising the integrated circuit of claim 1.

18. The mobile computing device of claim 17, wherein the computing device includes a smartphone.

19. An integrated circuit adapted for mobile communication, comprising:
a first circuit portion arranged to perform communication via first and second wireless communication protocols; and
a second circuit portion arranged to perform communication in conjunction with the first circuit portion via the first and second wireless communication protocols,
wherein the first and second circuit portions are electrically coupled to enable the mobile communication using the first and second wireless communication protocols,
wherein the first circuit portion further includes a transceiver and a digital baseband processor, and wherein the digital baseband processor is configured to adaptively operate between first and second clock frequencies, the first clock frequency used when the circuit is configured to perform communication via the first wireless communication protocol, and the second clock frequency used when the circuit is configured to perform communication via the second wireless communication protocol.

* * * * *